US012560969B2

(12) United States Patent
Lee

(10) Patent No.: US 12,560,969 B2
(45) Date of Patent: Feb. 24, 2026

(54) DISPLAY APPARATUS AND METHOD FOR MANUFACTURING DISPLAY APPARATUS

(71) Applicant: LG Display Co., Ltd., Seoul (KR)

(72) Inventor: Junjae Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 564 days.

(21) Appl. No.: 17/985,105

(22) Filed: Nov. 10, 2022

(65) Prior Publication Data

US 2023/0213976 A1    Jul. 6, 2023

(30) Foreign Application Priority Data

Dec. 30, 2021    (KR) ........................ 10-2021-0192683

(51) Int. Cl.
*G06F 1/16*        (2006.01)
*H04M 1/02*        (2006.01)
*H10K 71/50*       (2023.01)

(52) U.S. Cl.
CPC .......... *G06F 1/1652* (2013.01); *G06F 1/1656* (2013.01); *H04M 1/0268* (2013.01); *H10K 71/50* (2023.02); *G06F 1/1637* (2013.01); *H04M 1/0266* (2013.01); *H05K 2201/10128* (2013.01)

(58) Field of Classification Search
CPC .... G06F 1/1652; G06F 1/1656; G06F 1/1673; H04M 1/0268; H04M 1/0266; H10K 2201/10128; H10K 71/50
USPC ......................................................... 428/1.6
See application file for complete search history.

(56) References Cited

U.S. PATENT DOCUMENTS

| | | | |
|---|---|---|---|
| 9,285,835 B2 | 3/2016 | Lee et al. | |
| 11,222,934 B2 | 1/2022 | Kim | |
| 11,355,413 B2 | 6/2022 | Lee et al. | |
| 11,450,824 B2 | 9/2022 | Kim | |
| 11,532,797 B2 | 12/2022 | Paek et al. | |
| 11,839,135 B2 | 12/2023 | Zhao et al. | |
| 2010/0033443 A1 | 2/2010 | Hashimoto | |
| 2016/0014912 A1 | 1/2016 | Shih | |
| 2016/0203787 A1 | 7/2016 | Park et al. | |
| 2018/0160527 A1 | 6/2018 | Kim | |
| 2019/0198586 A1 | 6/2019 | Kim | |

(Continued)

FOREIGN PATENT DOCUMENTS

| | | |
|---|---|---|
| CN | 101661358 A | 3/2010 |
| CN | 105788475 A | 7/2016 |

(Continued)

OTHER PUBLICATIONS

Korean Intellectual Property Office, Office Action, Korean Patent Application No. 10-2021-0192683, Dec. 8, 2024, 14 pages.

(Continued)

*Primary Examiner* — Ruiyun Zhang

(74) *Attorney, Agent, or Firm* — Fenwick & West LLP

(57)        ABSTRACT

Disclosed is a display apparatus including a display panel including a front portion, a bent portion, and a pad portion bent from the bent portion and positioned under the front portion, a first plate disposed between the front portion and the pad portion and disposed under the front portion, and a second plate disposed between the front portion and the pad portion and disposed on a top face of the pad portion, wherein the first plate includes a porous member, wherein the second plate includes a transparent area.

18 Claims, 23 Drawing Sheets

(56) References Cited

U.S. PATENT DOCUMENTS

| | | | | |
|---|---|---|---|---|
| 2019/0212788 A1* | 7/2019 | Kwak | .................... | H04N 23/45 |
| 2019/0213925 A1 | 7/2019 | Ha et al. | | |
| 2020/0081162 A1* | 3/2020 | Park | ...................... | H10K 59/87 |
| 2020/0211920 A1 | 7/2020 | Lee et al. | | |
| 2020/0270501 A1* | 8/2020 | Shin | ........................ | B32B 27/42 |
| 2021/0201711 A1 | 7/2021 | Yun et al. | | |
| 2021/0202868 A1 | 7/2021 | Paek et al. | | |

FOREIGN PATENT DOCUMENTS

| | | | |
|---|---|---|---|
| CN | 107886848 | A | 4/2018 |
| CN | 110010663 | A | 7/2019 |
| CN | 209803497 | U | 12/2019 |
| CN | 111029325 | A | 4/2020 |
| CN | 112017538 | A | 12/2020 |
| CN | 112740435 | A | 4/2021 |
| CN | 113053948 | A | 6/2021 |
| CN | 113707019 | A | 11/2021 |
| KR | 10-2006-0035179 | A | 4/2006 |
| KR | 10-2019-0077136 | A | 7/2019 |
| KR | 10-2020-0078887 | A | 7/2020 |
| KR | 10-2020-0083697 | A | 7/2020 |
| KR | 10-2021-0026578 | A | 3/2021 |
| KR | 10-2021-0086284 | A | 7/2021 |

OTHER PUBLICATIONS

China National Intellectual Property Administration, Office Action, Chinese Patent Application No. 202211647710.4, Jun. 30, 2025, 16 pages.

\* cited by examiner (a)

(b)

(a)

(b)

(a)

(b)

(a)

(b)

(a)

(b)

(a)

(b)

DISPLAY APPARATUS AND METHOD FOR MANUFACTURING DISPLAY APPARATUS

CROSS-REFERENCE TO RELATED APPLICATIONS

This application claims priority from Republic of Korea Patent Application No. 10-2021-0192683 filed on Dec. 30, 2021 in the Korean Intellectual Property Office, and all the benefits accruing therefrom under 35 U.S.C. 119, the contents of which in its entirety are herein incorporated by reference.

BACKGROUND

Field

The present disclosure is related to a display apparatus and a method for manufacturing a display apparatus in which whether a flexible circuit board and a display panel are electrically connected to each other may be easily identified, thereby improving productivity.

Description of Related Art

Display apparatuses are implemented in a variety of forms, such as televisions, monitors, smart phones, tablet PCs, laptops, and wearable devices.

In general, a display apparatus includes a display area for displaying a screen and a non-display area formed along an outer edge of the display area.

In the display apparatus, the non-display area is also referred to as a bezel area. When the bezel area is thick, the user's gaze is dispersed. When the bezel area is thin, the user's gaze may be fixed on the screen of the display area and thus immersion may be increased.

In other words, when the bezel area becomes thinner, an overall size of the display apparatus may be reduced while increasing the user's immersion. Thus, demand from consumers for a display apparatus having the reduced bezel area as much as possible is increasing.

SUMMARY

As users' demand for a display apparatus in which portability is important increases, demand for development of a slimmer display apparatus with strong stiffness is also increasing.

For example, when the display apparatus is dropped from a high place, strong stiffness against instantaneous impact applied thereto may be required.

In an example, the instantaneous impact stiffness may be measured using a ball-drop test in which an iron ball is freely dropped from a predetermined height to the display apparatus. Thus, stiffness corresponding to the instantaneous impact of the display apparatus may be measured based on the measured instantaneous impact stiffness.

Further, in order to increase the portability of the display apparatus, it may be necessary to reduce the overall thickness of the display apparatus and to reduce the bezel area.

The display apparatus may include a display panel that implements a display screen and a flexible circuit board on or to which a circuit for applying various signals to the display panel is mounted or connected.

The flexible circuit board may be fixedly connected to a distal end of the display panel.

For example, a conductive adhesive such as ACF (anisotropic conductive film) including conductive balls may be interposed between the flexible circuit board and the display panel, and then heat and pressure may be applied to the adhesive to cure the conductive adhesive such that the flexible circuit board and the display panel may be electrically connected to each other.

In this case, as the conductive ball included in the anisotropic conductive film is pressed, indentation may occur between the flexible circuit board and the display panel.

When the indentation occurs, it may be determined that the electrical connection between the flexible circuit board and the display panel is normally established.

However, when the flexible circuit board and the display panel are not properly aligned with each other and are not fixed to each other, and thus the conductive ball is not properly pressed, the indentation may not occur between the flexible circuit board and the display panel.

When the indentation does not occur in this way, it may be determined that the electrical connection between the flexible circuit board and the display panel is not properly made.

Therefore, whether the electrical connection between the flexible circuit board and the display panel is normally made may be identified based on occurrence or non-occurrence of the indentation between the flexible circuit board and the display panel.

A state in which indentation does not occur between the flexible circuit board and the display panel means that the electrical connection therebetween is not made normally. Thus, when the indentation does not occur, various signals may not be properly transmitted to the display panel through the flexible circuit board, which may lead to defects in the display apparatus.

This indentation may be identified on the back face as the other face to one face of the display panel that the flexible circuit board is in contact with.

However, when the display panel is made of a non-transparent material or when a member made of a non-transparent material are disposed under the display panel, there is a difficulty in identifying whether the indentation has occurred on the back face of the display panel.

Accordingly, the inventors of the present disclosure have invented a display apparatus and a method for manufacturing the display apparatus in which whether the flexible circuit board and the display panel are electrically connected to each other may be easily identified while the device has strong stiffness and is slimmer.

A purpose according to one embodiment of the present disclosure is to provide a display apparatus and a method for manufacturing the display apparatus in which whether the circuit board and the display panel are electrically connected to each other may be easily identified, thereby improving productivity.

Another purpose according to an embodiment of the present disclosure is to provide a display apparatus being slimmer and having strong stiffness and a method for manufacturing the display apparatus.

Purposes of the present disclosure are not limited to the above-mentioned purpose. Other purposes and advantages of the present disclosure that are not mentioned may be understood based on following descriptions, and may be more clearly understood based on embodiments of the present disclosure. Further, it will be easily understood that the purposes and advantages of the present disclosure may be realized using means shown in the claims and combinations thereof.

One aspect of the present disclosure provides a display apparatus including a display panel including a front portion, a bent portion, and a pad portion bent from the bent portion and positioned under the front portion, a first plate disposed between the front portion and the pad portion and disposed under the front portion, and a second plate disposed between the front portion and the pad portion and disposed on a top face of the pad portion, wherein the first plate includes a porous member, wherein the second plate includes a transparent area.

Another aspect of the present disclosure provides a method for manufacturing a display apparatus, the method including providing a display panel, positioning first and second plates having different areas on a back face of the display panel, wherein the second plate includes a transparent area, forming a spacer between the first plate and the second plate, connecting a flexible circuit board to a distal end of a top face of the display panel such that the flexible circuit board vertically and at least partially overlaps the transparent area of the second plate; and bending the second plate from the spacer toward the back face of the display panel such that the second plate positioned under the first plate.

Another aspect of the present disclosure provides a display apparatus a display panel including a first portion for displaying an image and a second portion with a driver circuit, wherein at least a part of the display panel is bent such that the second portion is positioned under the first portion, a first plate disposed below the first portion of the display panel, a second plate disposed below the first plate and on a top surface of the second portion of the display panel, wherein at least a part of the second plate is transparent, and a circuit board attached to a bottom surface of the second portion of the display panel, wherein the circuit board overlaps the part of the second plate that is transparent.

According to embodiments of the present disclosure, the device includes the second plate including the transparent area on a portion of a back face of the display panel corresponding to a distal end of a top face of the display panel to which the flexible circuit board is connected. Thus, a process operator may easily identify whether indentation in an overlapping area of the flexible circuit board and the display panel has occurred through the transparent area of the second plate.

Accordingly, the process operator may easily identify whether the flexible circuit board and the display panel are electrically connected to each other based on the occurrence or non-occurrence of the indentation, thereby improving productivity and reducing occurrence of defects in the display apparatus due to connection defects.

Further, according to the embodiment of the present disclosure, the first plate including the porous member may be disposed on the back face of the display panel. The second plate spaced apart from the first plate and including the transparent area may be disposed thereon. Thus, the porous member may increase the impact stiffness of the display apparatus. A slimmed display apparatus may be realized via application of various embodiments of the second plate which is formed separately from the first plate.

Effects of the present disclosure are not limited to the above-mentioned effects, and other effects as not mentioned will be clearly understood by those skilled in the art from following descriptions.

DETAILED DESCRIPTION

Figure 1A:
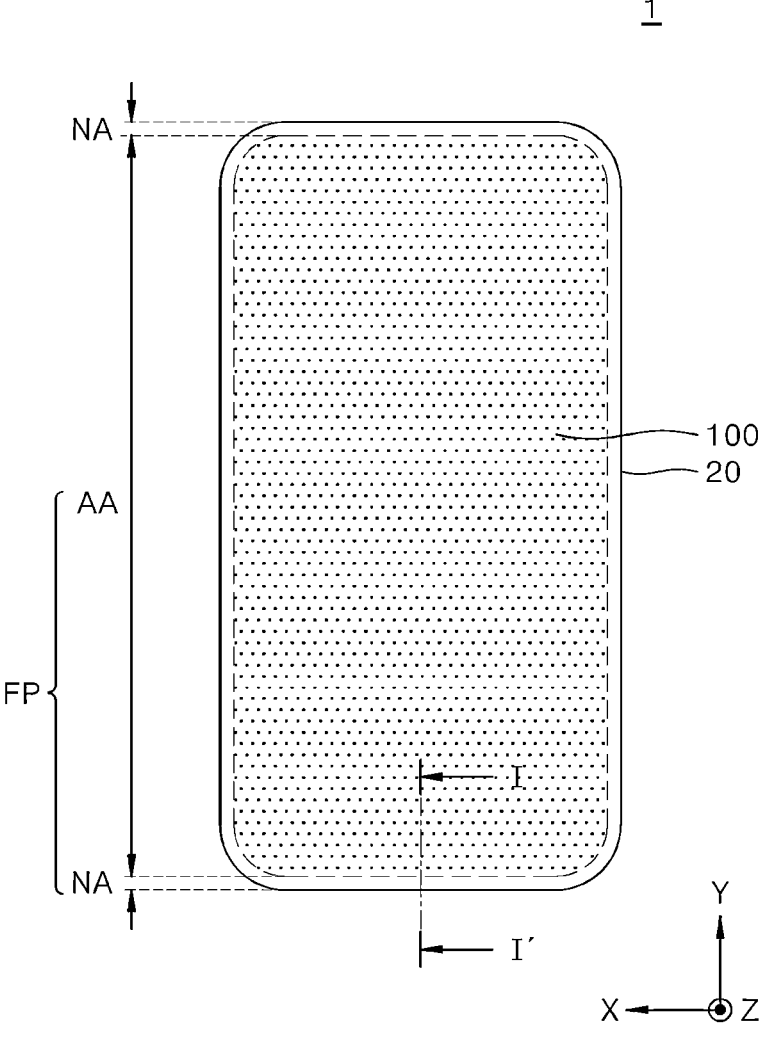
FIG. 1A show a front face of a display apparatus according to an embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the present disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like may be disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like may be disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is not indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The display apparatus according to the present disclosure may be applied to an organic light-emitting display apparatus. The disclosure is not limited thereto. The display apparatus according to the present disclosure may be applied to various display apparatuses such as a micro LED display apparatus or a quantum dot display apparatus.

Hereinafter, a display apparatus according to an embodiment of the present disclosure will be described in detail with reference to the drawings.

Figure 1B:
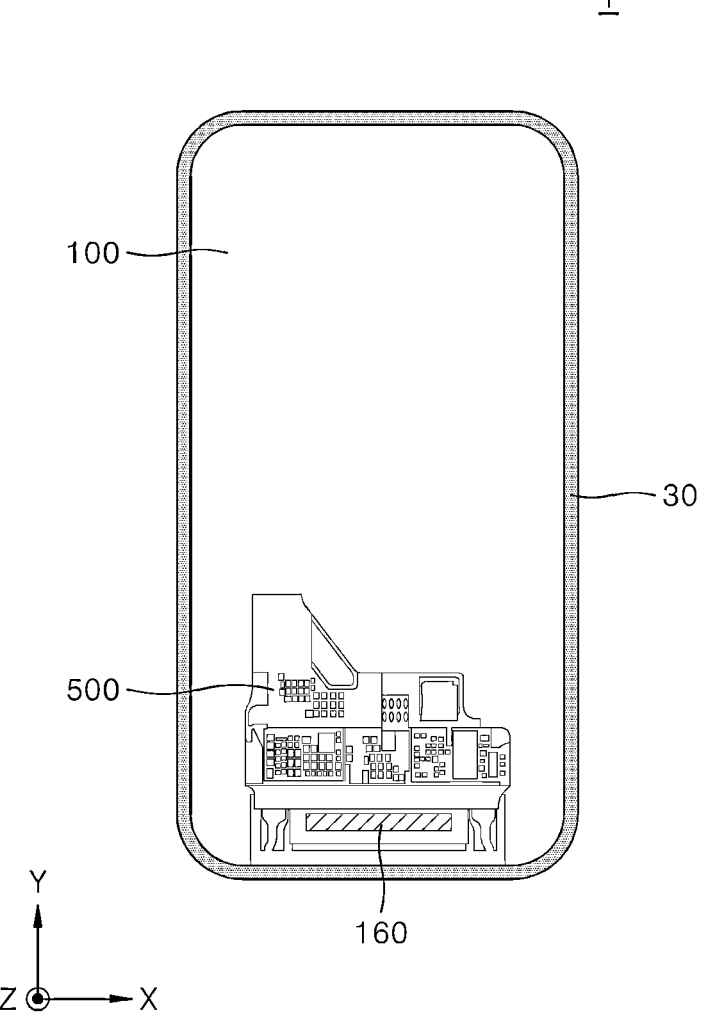
FIG. 1B shows a back face of the display apparatus in which a casing is removed according to an embodiment of the present disclosure.
Figure 1C:
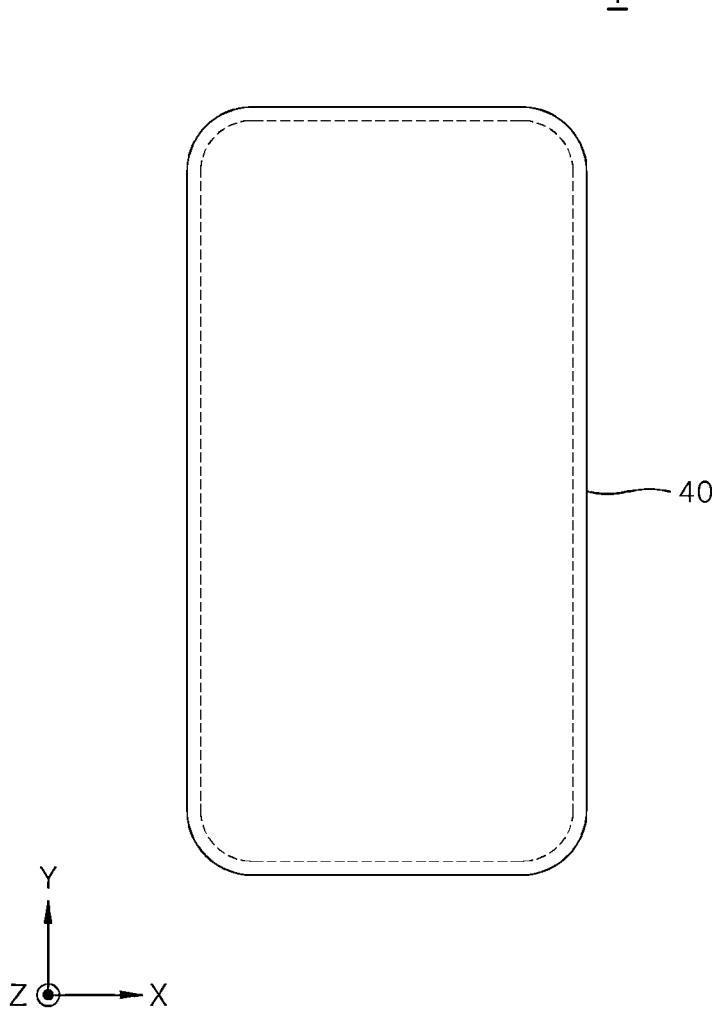
FIG. 1C shows a back face of a display apparatus according to an embodiment of the present disclosure.

FIG. 1A and FIG. 1C respectively show front and back faces of the display apparatus according to an embodiment of the present disclosure, and FIG. 1B shows the back face of the display apparatus in which a casing is removed.

As used herein, each of frontward and upward directions may mean a Z-axis direction, and each of backward and downward directions may mean a −Z-axis direction.

A display apparatus 1 may include a cover member 20 and a display panel 100 attached to a bottom of the cover member 20. A direction from a top to the bottom of the cover member may refer to the downward direction (−Z axis direction).

The cover member 20 may be disposed to constitute the front portion of the display apparatus 1 to protect the display apparatus 1 from external impact.

An edge portion of the cover member 20 may have a curved portion or a bent portion that is curved or bent toward the back face of the display apparatus 1.

Since the cover member 20 may be disposed to cover a side face of the display panel 100 of the display apparatus 1, the member 20 may protect the display panel 100 from external impact not only on the front face of the display apparatus 1 but also on a side face thereof.

The cover member 20 may overlap the display area AA of the display panel that displays an image. For example, the cover member 20 may be made of a transparent plastic material that may transmit an image therethrough, or may be made of a cover glass of a transparent glass material. The present disclosure is not limited thereto.

A casing 40 for supporting the cover member 20 may be disposed on the back face of the display apparatus 1.

The casing 40 may serve as a housing that protects the rear face of the display apparatus 1, and may function as a casing constituting the outermost shell of the display apparatus 1.

The casing 40 may be made of various materials such as plastic, metal, or glass.

A middle frame 30 may be additionally disposed between the cover member 20 and the casing 40.

The middle frame 30 may accommodate therein the display panel 100. One side of the middle frame 30 may contact the cover member 20 such that the middle frame supports the cover member 20.

The middle frame 30 may serve as a housing that protects the rear face of the display panel 100.

The middle frame 30 may have a structure to accommodate therein additional components such as the display panel 100 and a battery disposed on the back face of the display panel 100 to apply power to the display apparatus 1. The structure thereof is not particularly limited.

For example, the middle frame 30 may have a structure in which the middle frame covers the back face of the display panel 100 so that the display panel 100 may be housed in one portion of the middle frame 30, and an additional component such as a battery may be accommodated in the other portion of the middle frame 30.

Further, the middle frame 30 may be formed to cover a portion of the back face of the display panel 100 so that an area is not divided via the middle frame 30 and the display panel 100 and additional components such as batteries are accommodated in the middle frame 30 such that the panel 100 and the additional components are in contact with each other.

A front portion FP of the display panel 100 may be disposed on a bottom face of the cover member 20.

The front portion FP may include a pixel array including a plurality of pixels having a plurality of light-emitting elements, and driving transistors, and signal lines transmitting a drive signal to the pixels, so that an image may be displayed from the front portion.

The front portion FP may include a display area AA (active area) where the image is displayed and a non-display area NA (non-active area) other than the display area AA. The non-display area NA may be formed as an edge area surrounding the display area AA.

The display area AA and the non-display area NA may be equally applied to the cover member 20.

An area of the cover member 20 through which the image transmits may be the display area AA thereof.

An area of the cover member 20 which surrounds the display area AA and through which the image does not transmit may be a non-display area NA thereof.

The non-display area NA may be defined as a bezel area.

The display panel 100 disposed under the cover member 20 may include a bent portion which extends from one side of the front portion FP thereof and is bent downwardly.

The bent portion may be located at the outermost part of the display panel 100, and thus may be easily exposed to external impact. The bent portion may be easily deformed or broken when the impact is applied thereto. Accordingly, a support member or a reinforcing member for protecting the bent portion may be added to absorb the impact.

Hereinafter, a structure of the display apparatus 1 according to an embodiment of the present disclosure will be described.

Figure 2:
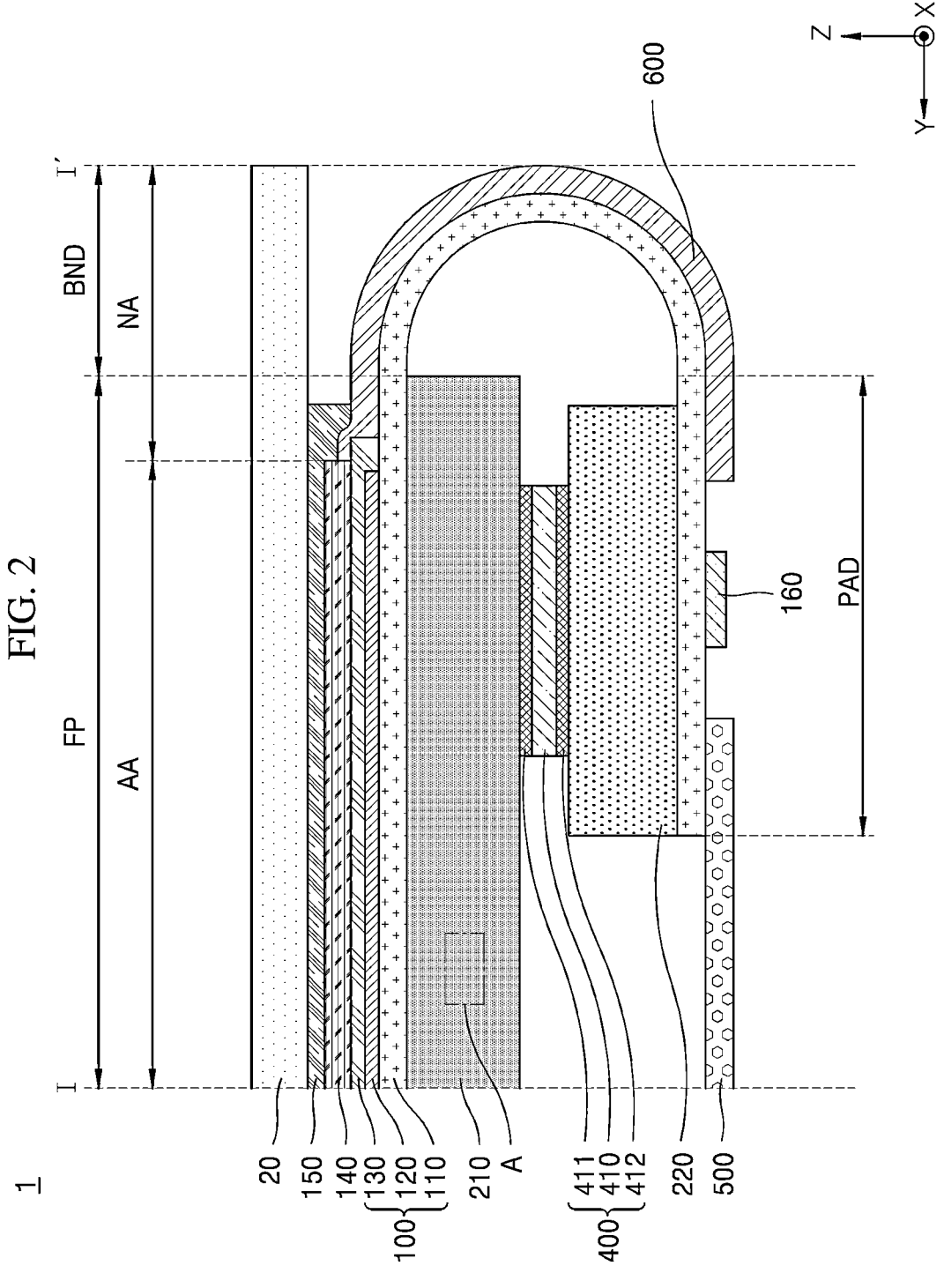
FIG. 2 is a cross-sectional view of a I-I' direction of the display apparatus according to an embodiment of the present disclosure.

FIG. 2 is a cross-sectional view taken along a line I-I' of the display apparatus 1 according to an embodiment of the present disclosure.

The display apparatus 1 may include the cover member 20 as the topmost portion and the display panel 100 disposed under the cover member 20.

The display apparatus 1 may include the display panel 100 having the front portion FP, a bent portion BND, and a pad portion PAD bent from the bent portion BND so as to be positioned on a back face of the front portion FP, a first plate 210 disposed between the front portion FP and the pad portion PAD, and disposed below the front portion FP, and a second plate 220 disposed between the front portion FP and the pad portion PAD, and disposed on a top face of the pad portion PAD.

A second connection member 400 as a connection member may be disposed between the first plate 210 and the second plate 220 to fix the first plate 210 and the second plate 220 to each other.

A first connection member 150 may be disposed between the cover member 20 and the display panel 100.

The first connection member 150 may connect or couple the cover member 20 and the display panel 100 to each other.

For example, the first connection member 150 may act as a fixing member. The disclosure is not limited to the terminology.

Since the first connection member 150 may be disposed to vertically overlap the display area AA, the member 150 may be made of a material through which the image of the display panel 100 may transmit.

For example, the first connection member 150 may be made of or may include a material such as OCA (Optical Clear Adhesive), OCR (Optical Clear Resin), or PSA (Pressure Sensitive Adhesive). However, the present disclosure is not limited thereto.

The display panel 100 disposed under the cover member 20 may include the front portion FP, the bent portion BND, and the pad portion PAD which constitute a display substrate 110.

The front portion FP of the display panel 100 may be disposed under the first connection member 150. For example, the front portion FP may be a portion where the image is displayed. The front portion may include the display substrate 110, the pixel array 120, and the encapsulation portion 130.

In addition, a polarizing plate 140 may be disposed on a top face of the encapsulation portion 130 of the display panel 100.

The bent portion BND of the display panel 100 may extend from one side of the front portion FP and be bent downwardly (in the −Z-axis direction) and then horizontally (in a Y-axis direction). The bent portion BND may include the display substrate 110 and the signal line.

The pad portion PAD of the display panel 100 may extend from the bent portion BND and be disposed under the front portion FP.

The pad portion PAD may include the display substrate 110, the signal line, and a pad electrode connected to the signal line. A driver circuit 160 or a flexible circuit board 500 for driving a pixel may be mounted on the pad electrode.

The polarizing plate 140 may be disposed on the top face of the front portion FP and thus may be disposed on the top face of the display panel 100. In addition, a functional layer for improving display performance of the display apparatus may be further disposed between the first connection member 150 and the polarizing plate 140.

The polarizing plate 140 prevents reflection of external light and improves the outdoor visibility and contrast ratio of the image displayed on the display panel 100.

The display panel 100 may include the display substrate 110, the pixel array 120 disposed on the display substrate 110, and the encapsulation portion 130 disposed to cover the pixel array 120.

A portion of the display substrate 110 may constitute a bottom of the display panel 100.

The display substrate 110 may constitute the front portion FP, the bent portion BND, and the pad portion PAD.

The display substrate 110 may be made of a flexible plastic material and may have flexible properties.

The display substrate 110 may include polyimide, or may be made of a thin glass material having flexibility.

The pixel array 120 may be disposed on the display substrate 110. The pixel array 120 may display an image. An area where the pixel array 120 may be disposed may be the display area AA.

Accordingly, an area of the cover member 20 corresponding to the pixel array 120 may be a display area AA of the cover member 20, while an area of the cover member 20 other than the display area AA may be a non-display area NA of the cover member 20.

The pixel array 120 may include light-emitting elements, thin-film transistors for driving the light-emitting elements, and the signal lines such as a gate line, a data line, and a pixel driving power line on the display substrate 110.

The pixel array 120 may include pixels that display images based on signals supplied to the signal lines. The pixel may include the light-emitting element and the thin-film transistor.

The light-emitting element may include an anode electrode electrically connected to the thin-film transistor, a light-emitting layer formed on the anode electrode, and a cathode electrode for supplying a common voltage.

The thin-film transistor may include a gate electrode, a semiconductor layer, a source electrode, and a drain electrode. The semiconductor layer of the thin-film transistor may include silicon such as a-Si, poly-Si, or low-temperature poly-Si, or oxide such as IGZO (Indium-Gallium-Zinc-Oxide). The present disclosure is not limited thereto.

The anode electrode may be disposed in each pixel area and in a corresponding manner to an opening area defined according to a pattern shape of the pixel and may be electrically connected to the thin-film transistor.

The light-emitting element may include a light-emitting layer formed between the anode electrode and the cathode electrode. The light-emitting element may be implemented to emit light of the same color such as white light for each pixel or to emit light of a different color such as red, green, or blue for each pixel.

The encapsulation portion 130 may be disposed on the display substrate 110 so as to cover the pixel array 120.

The encapsulation portion 130 may prevent oxygen, moisture, or foreign material from invading the light-emitting layer of the pixel array 120. For example, the encapsulation portion 130 may be formed in a multi-layer structure in which an organic material layer and an inorganic material layer are alternately stacked. The present disclosure is not limited thereto.

The front portion FP of the display panel 100 may include the display substrate 110, the pixel array 120, and the encapsulation portion 130. The front portion may be formed in a flat manner, or the front portion may be formed in a flat manner except for an edge portion thereof.

The first plate 210 may be connected or coupled to the back face of the front portion FP so as to maintain the flat state of the front portion FP.

The bent portion BND of the display panel 100 may be free of the pixel array 120, the encapsulation portion 130, and the first plate 210, and may include the display substrate 110. The bent portion BND may be a portion that may be easily bent in a direction desired by the user.

The pad portion PAD of the display panel 100 may be free of the pixel array 120 and the encapsulation portion 130.

The second plate 220 may be connected or coupled to a back face of the pad portion PAD so that the pad portion PAD may be maintained in the flat state.

Therefore, the front portion FP of the display panel 100 may be disposed in the area in which the screen is displayed, and the pad portion PAD may be bent from the bent portion BND horizontally and inwardly and may be disposed below the front portion FP, that is, on the back face of the front portion FP.

The first plate 210 disposed under the front portion FP of the display panel 100 and the second plate 220 disposed above the pad portion PAD may maintain the front portion FP in the flat state while complementing the rigidity of the display substrate 110.

Each of the first plate 210 and the second plate 220 may be formed to have a certain strength and thickness to complement the rigidity of the display substrate 110, and may not be formed in a bent portion area where the bent portion BND is located.

Based on a shape before the display panel 100 is bent, the first plate 210 and the second plate 220 may be disposed under the display substrate 110 and spaced apart from each other.

Based on a shape after the display panel 100 is bent, the first plate 210 may be disposed under the front portion FP, and the second plate 220 may be disposed on the top face of the pad portion PAD.

The first plate 210 may include a porous member 300. The porous member 300 may be a metal foam.

Since the porous member 300 may function as a cushion layer of the first plate 210, such that the impact to various parts that may come into contact with the cushion plate 300 may be reduced.

The porous member 300 with an impact reducing function may reinforce the stiffness of the first plate 210.

Figure 3:
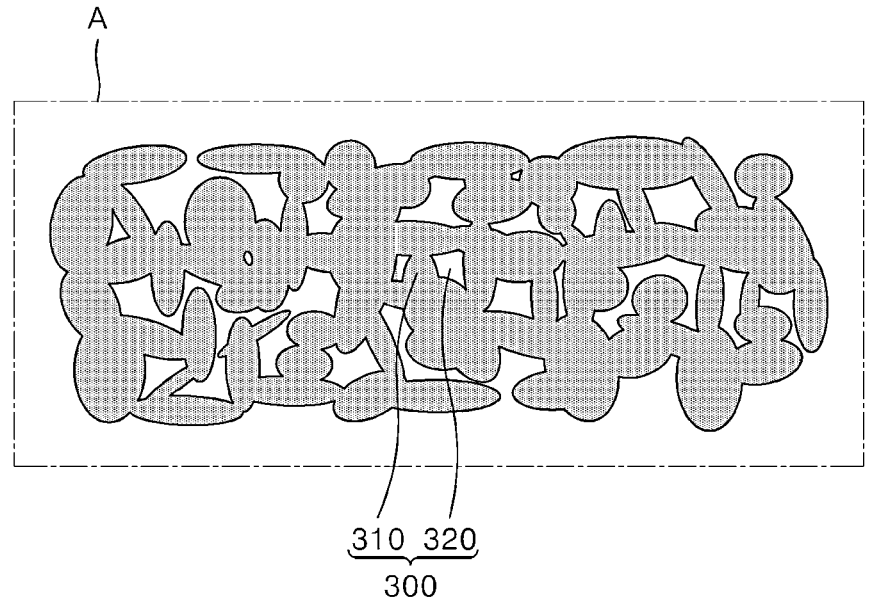
FIG. 3 is an enlarged cross-sectional view of a porous member according to an embodiment of the present disclosure.

Referring to FIG. 3, the porous member 300 may be a porous metal structure including a conductive metal 310 and a plurality of pores 320 positioned inside the conductive metal 310.

Since the conductive metal 310 of the porous member 300 is made of a metal with high thermal conductivity, the porous member 300 itself may provide an excellent heat-dissipation function. Because the porous member 300 has a metal structure with the plurality of pores 320 formed therein, the member 300 may provide an excellent cushion function.

Further, since the porous member 300 includes the plurality of pores 320 inside the conductive metal 310, and overall surface area thereof may be increased, such that the porous member 300 itself may provide an excellent heat-dissipation function.

The porous member 300 may be formed by a following manufacturing method by way of example. The present disclosure is not limited thereto.

The porous member 300 may be formed by sintering a metal foam precursor containing a metal powder.

The metal foam precursor refers to a structure before proceeding with a process, such as the sintering, performed to form the porous member 300.

For example, the metal foam precursor may be formed using a slurry containing a metal powder, a dispersant, and a binder.

The metal powder may be a metal powder in which one or more metal powders among a copper powder, a nickel powder, an iron powder, a SUS powder, a molybdenum powder, a silver powder, a platinum powder, a gold powder, an aluminum powder, a chromium powder, an indium powder, a tin powder, a magnesium powder, a phosphorus powder, a zinc powder, and a manganese powder are mixed, or a powder of an alloy of one or more metals, but may not be limited thereto.

The dispersant may, for example, use alcohol, but may not be limited thereto.

In this case, the alcohol may use monohydric alcohol having 1 to 20 carbon atoms, such as methanol, ethanol, propanol, pentanol, octanol, ethylene glycol, propylene glycol, pentanol, 2-methoxyethanol, 2-ethoxyethanol, 2-butoxyethanol, glycerol, texanol, or terpineol, dihydric alcohol having 1 to 20 carbon atoms, such as ethylene glycol, propylene glycol, hexanediol, octanediol, or pentanediol, or polyhydric alcohol, but may not be limited thereto.

A type of binder may not be particularly limited, and may be selected based on a type of the metal component or the dispersant used in preparing the slurry.

For example, the binder may use alkyl cellulose having an alkyl group having 1 to 8 carbon atoms, such as methyl cellulose or ethyl cellulose, polyalkylene carbonate having an alkylene unit having 1 to 8 carbon atoms, such as polypropylene carbonate or polyethylene carbonate, or a polyvinyl alcohol-based binder, such as polyvinyl alcohol or polyvinyl acetate, but may not be limited thereto.

After forming the slurry to contain the metal powder, the dispersant, and the binder as described above, the slurry may be injected into a mold having a predetermined shape or coated on a substrate to form the metal foam precursor.

The metal foam precursor thus formed may be formed into the porous member 300 through the sintering process.

In this case, conditions of the sintering process are not particularly limited as long as the sintering process is performed at a temperature and for a time of levels at which a solvent contained in the slurry may be removed to a desired level. For example, the sintering may be performed in a temperature range from about 50° C. to 250° C. for a predetermined time, but may not be limited thereto.

The second plate 220 may include a transparent material. At least a partial area thereof may be formed as a transparent area. In one embodiment, at least a part of the second plate 220 may be transparent. The present disclosure is not limited thereto. The second plate 220 may also include an opaque material or a translucent material.

For example, the second plate 220 may include at least one of polyethylene terephthalate (PET), polyimide (PI), and polyethylene naphthalate (PEN). The present disclosure is not limited thereto.

The first plate 210 and the second plate 220 may be formed to have substantially the same thickness, but the present disclosure is not limited thereto.

The second connection member 400 and the second plate 220 may be disposed under the first plate 210.

The second plate 220 may be disposed under the second connection member 400.

In order to place the second plate 220, the second plate 220 may be first attached to the back face of the pad portion PAD, the bent portion BND may be bent, and the second plate 220 may be attached and fixed to a bottom of the second connection member 400.

In a state in which the second plate 220 is fixed to the second connection member 400, the second plate 220 may be disposed on the pad portion PAD.

The second connection member 400 may be disposed between the first plate 210 and the second plate 220.

When the pad portion PAD of the display panel 100 is bent from the bent portion BND so as to be disposed under the front portion FP of the display panel 100, the restoring force to restore the display panel 100 to the state before the bending may be strong.

When the restoring force is strong, the pad portion PAD of the bent display panel 100 may not be fixed but may be lifted.

The second connection member 400 may function as a fixing member that fixes the bent display panel 100 so that the display panel may maintain its bent state.

The second connection member 400 may be formed to have a certain thickness in a thickness direction so as to maintain a constant curvature of the bent portion BND.

The second connection member 400 may be embodied as a double-sided tape having adhesive strength that may fix the second plate 220 and the first plate 210 to each other. The present disclosure is not limited thereto.

For example, the second connection member 400 may include a base layer 410 and a first adhesive layer 411 and a second adhesive layer 412 respectively formed on both opposing faces of the base layer 410.

Accordingly, the second connection member 400 may be fixed to the first plate 210 via the first adhesive layer 411 and fixed to the second plate 220 via the second adhesive layer 412.

The base layer 410 may serve as a support layer capable of maintaining the shape of the second connection member 400.

Each of the first adhesive layer 411 and the second adhesive layer 412 may include a transparent and adhesive material. For example, each of the first adhesive layer 411 and the second adhesive layer 412 may be made of or include a material such as OCA (Optical Clear Adhesive), OCR (Optical Clear Resin), or PSA (Pressure Sensitive Adhesive).

Alternatively, the second connection member 400 may be composed of a foam tape or a foam pad having an adhesive force and thus may further have an effect of reducing the impact.

The reinforcing member 600 may be disposed on a top face of the bent portion BND of the display panel 100.

The reinforcing member 600 may cover the bent portion BND and may extend to cover at least a partial area of each of the front portion FP and the pad portion PAD.

The reinforcing member 600 may include resin. For example, the reinforcing member 600 may include UV-curable acrylic resin. The present disclosure is not limited thereto.

Since the reinforcing member 600 may cover various signal lines disposed between the encapsulation portion 130 of the display panel 100 and the pad portion PAD, the member 600 may prevent moisture from invading into the signal lines while protecting the signal line from the external impact.

In order to increase the flexibility of the display panel 100, the bent portion BND may be free of other components except for the display substrate 110 and the signal lines. Thus, the reinforcing member 600 may supplement the rigidity of the bent portion BND in which the other components are absent.

In one example, the driver circuit 160 may be disposed on the other face to one face of the pad portion PAD of the display panel 100 on which the second plate 220 may be disposed.

The driver circuit 160 may be disposed in a form of a chip on plastic (COP) mounted on the display substrate 110. However, the present disclosure is not limited thereto.

The driver circuit 160 may generate a data signal and a gate control signal based on image data and a timing synchronization signal supplied from an external host driving system.

The driver circuit 160 may supply a data signal to the data line of each pixel via a display pad, and may supply a gate control signal to a gate driver circuit via the display pad.

The driver circuit 160 may be mounted in a chip mounting area defined in the display substrate 110, and may be electrically connected to the display pad, and may be connected to the signal lines of the gate driver circuit and the pixel array 120 disposed on the display substrate 110.

The display pad may be disposed at a distal end of the display substrate 110 on which the driver circuit 160 is mounted.

The display pad may be disposed on one face of the display substrate 110 and electrically connected to the flexible circuit board 500 on which a circuit board is mounted.

The flexible circuit board 500 may be electrically connected to the display pad disposed on the distal end of the display substrate 110 via a film attachment process using a conductive adhesive layer, and may be positioned on the back face of the display panel 100.

One example of a material of the conductive adhesive layer may include an anisotropic conductive film (ACF).

The circuit board may provide the image data and the timing synchronization signal supplied from the host driving system to the driver circuit 160, and may provide a voltage required to drive each of the pixel array 120 and the gate driver circuit and the driver circuit 160.

FIGS. 4 to 7 are process diagrams of a method for manufacturing a display apparatus according to an embodiment of the present disclosure.

In FIGS. 4 to 7, (a) is a back face view of the process diagram of the method for manufacturing the display apparatus, and (b) is a cross-sectional view thereof.

Figure 4:
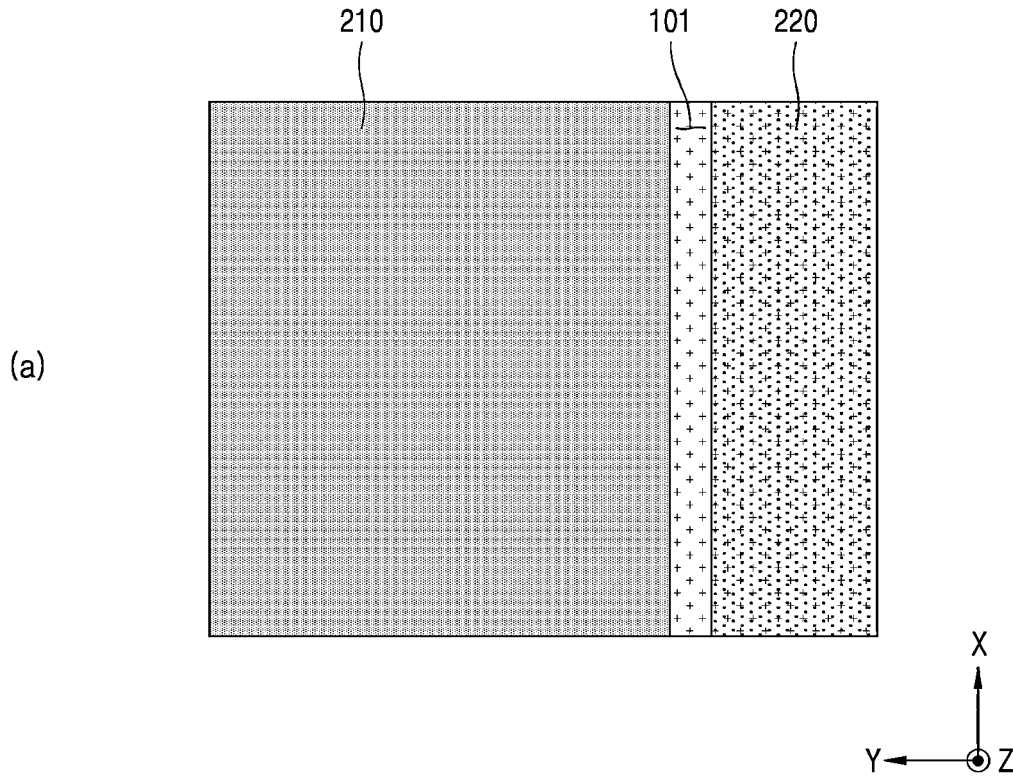
FIGS. 4 to 7 are process diagrams of a method for manufacturing a display apparatus according to an embodiment of the present disclosure.
Figure 4:
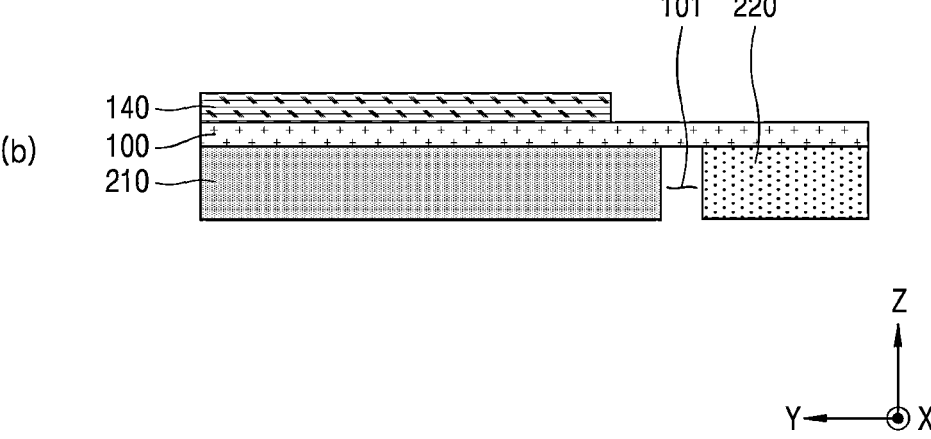

Referring to (a) and (b) in FIG. 4, the polarizing plate 140 may be formed on a top face as one face of the display panel 100, and the first plate 210 and the second plate 220 may be formed on a bottom face as the other face of the display panel 100.

The first plate 210 and the second plate 220 may be formed to be spaced from each other so that a spacer 101 is defined therebetween.

The first plate 210 may be disposed to vertically overlap with the polarizing plate 140, and the second plate 220 may be disposed not to vertically overlap with the polarizing plate 140.

The first plate 210 may be disposed to vertically overlap the polarizing plate 140 and may have an area substantially corresponding to the display area.

Therefore, the first plate 210 and the second plate 220 may have different areas. The first plate 210 may be formed to have a larger area than that of the second plate 220.

The first plate 210 and the second plate 220 may be formed in the same layer based on the other face of the display panel 100.

The first plate 210 and the second plate 220 may be fixed to the other face of the display panel 100 via an adhesive layer as a separate adhesive member.

The first plate 210 may include the conductive metal 310 and the porous member 300 including the plurality of pores 320 positioned inside the conductive metal 310 to increase the stiffness of the display apparatus 1.

The second plate 220 may include the transparent material. An entire area thereof may be formed as a transparent area.

For example, the second plate 220 may include one or more of polyethylene terephthalate (PET), polyimide (PI), and polyethylene naphthalate (PEN). The present disclosure is not limited thereto.

Figure 5:
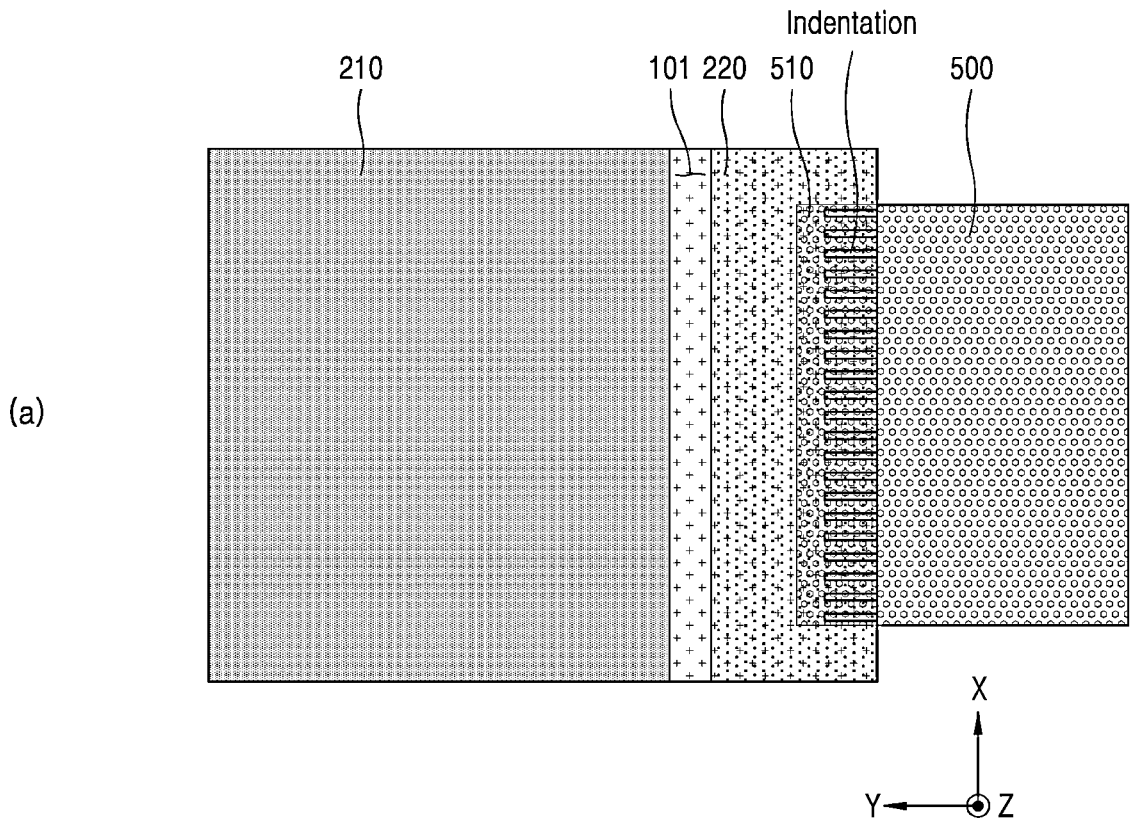
Figure 5:
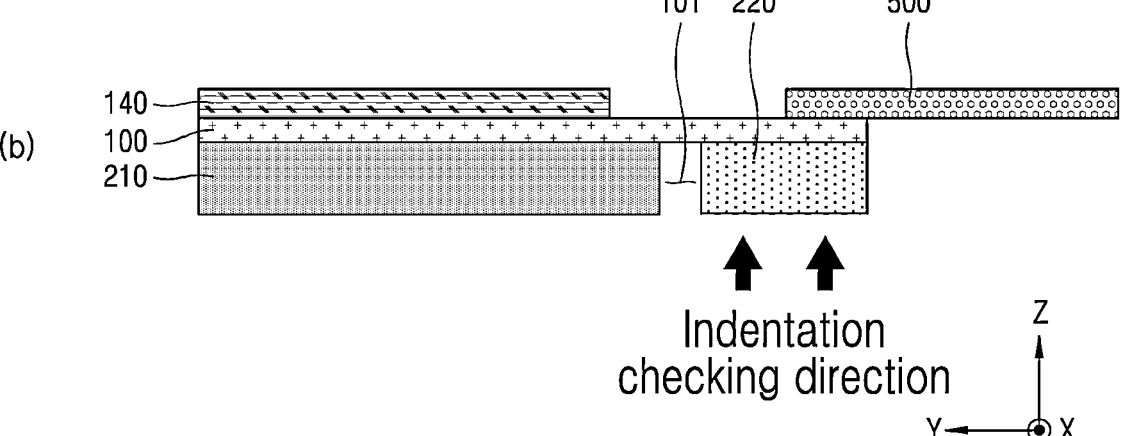

Referring to (a) and (b) in FIG. 5, the flexible circuit board 500 may be electrically connected to the display panel 100 and fixed thereto and at a distal end of the top face as one face of the display panel 100 opposite to the other face of the display panel 100 on which the second plate 220 is disposed.

For example, a conductive adhesive such as ACF (anisotropic conductive film) including conductive balls may be interposed between the flexible circuit board 500 and the display panel 100, and then heat and pressure may be applied to the adhesive to cure the conductive adhesive such that the flexible circuit board and the display panel may be electrically connected to each other.

In this case, as the conductive ball included in the anisotropic conductive film is pressed, indentation may occur between the flexible circuit board and the display panel. Thus, one or more indentations may be formed at an interface between the flexible circuit board 500 and the portion of the second plate 220 where the flexible circuit board 500 is attached.

When the indentation occurs, it may be determined that the electrical connection between the flexible circuit board 500 and the display panel 100 is normally established.

According to an embodiment of the present disclosure, the second plate 220 includes the transparent material such that the entire area of the second plate 220 may be a transparent area.

Therefore, the overlapping area 510 between the flexible circuit board 500 and the display panel 100 and may be identified through the second plate 220 from a position below the plate 220. Whether or not indentation occurs in the overlapping area 510 may be easily identified.

Thus, according to the embodiment of the present disclosure, the second plate 220 including the transparent area is disposed on a portion of the back face of the display panel 100 corresponding to the distal end of the top face of the display panel 100 to which the flexible circuit board 500 is connected. Thus, a process operator may easily identify whether the indentation in the overlapping area of the flexible circuit board 500 and the display panel 100 has occurred through the transparent area of the second plate 220.

Accordingly, the process operator may easily identify whether the flexible circuit board 500 and the display panel 100 are electrically connected to each other, based on the occurrence or non-occurrence of the indentation, thereby improving the productivity and reducing the occurrence of defects in the display apparatus 1 due to connection defects.

Figure 6:
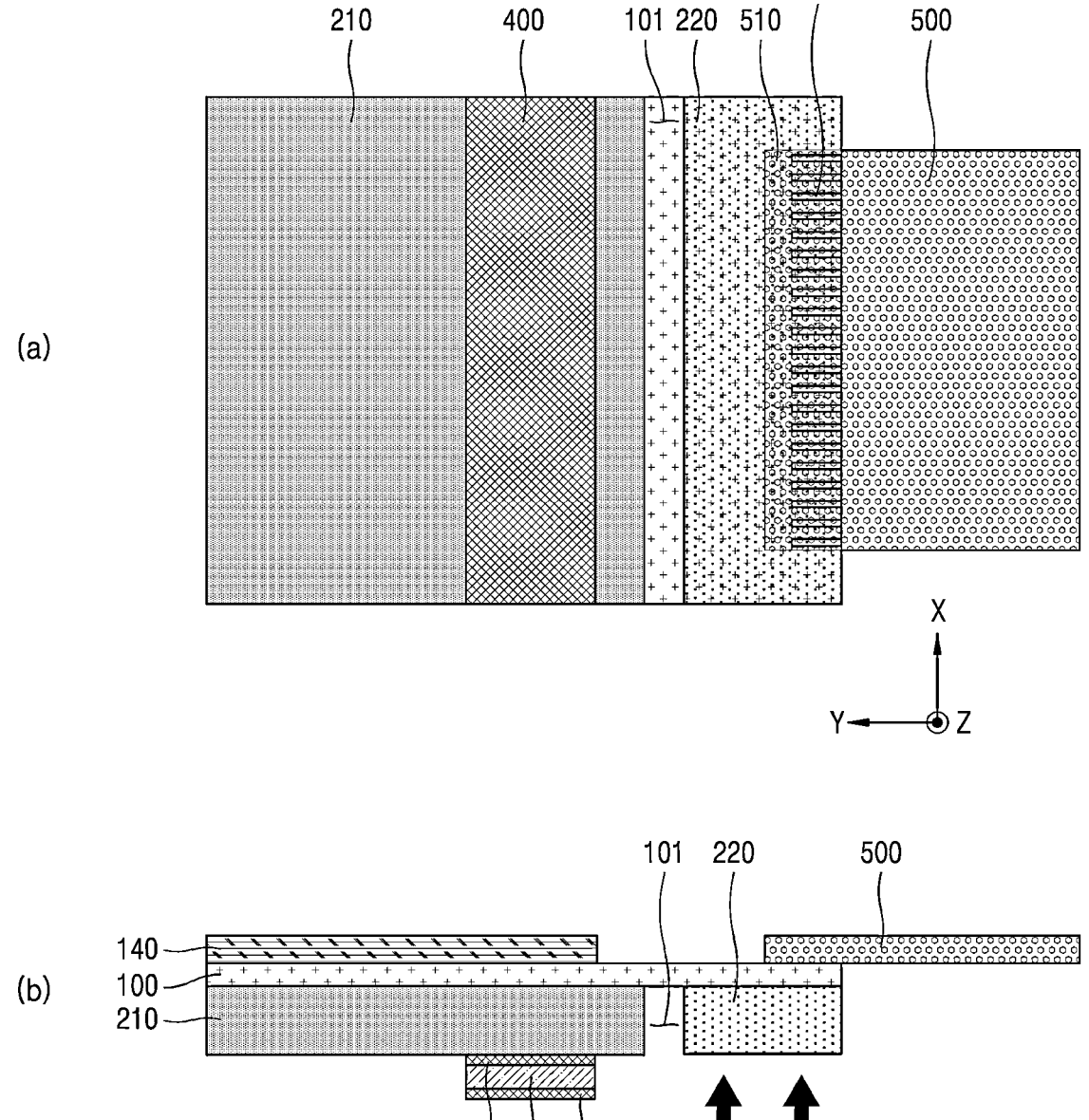

Referring to (a) and (b) in FIG. 6, the second connection member 400 may be formed on the back face of the first plate 210.

The second connection member 400 may include the base layer 410 and the first adhesive layer 411 and the second adhesive layer 412 respectively formed on both opposing faces of the base layer 410.

The second connection member 400 may be fixed to the first plate 210 via the first adhesive layer 411.

The second connection member 400 may be disposed at a position overlapping the second plate 220 disposed on the back face of the display panel 100 when the display panel 100 is bent.

Figure 7:
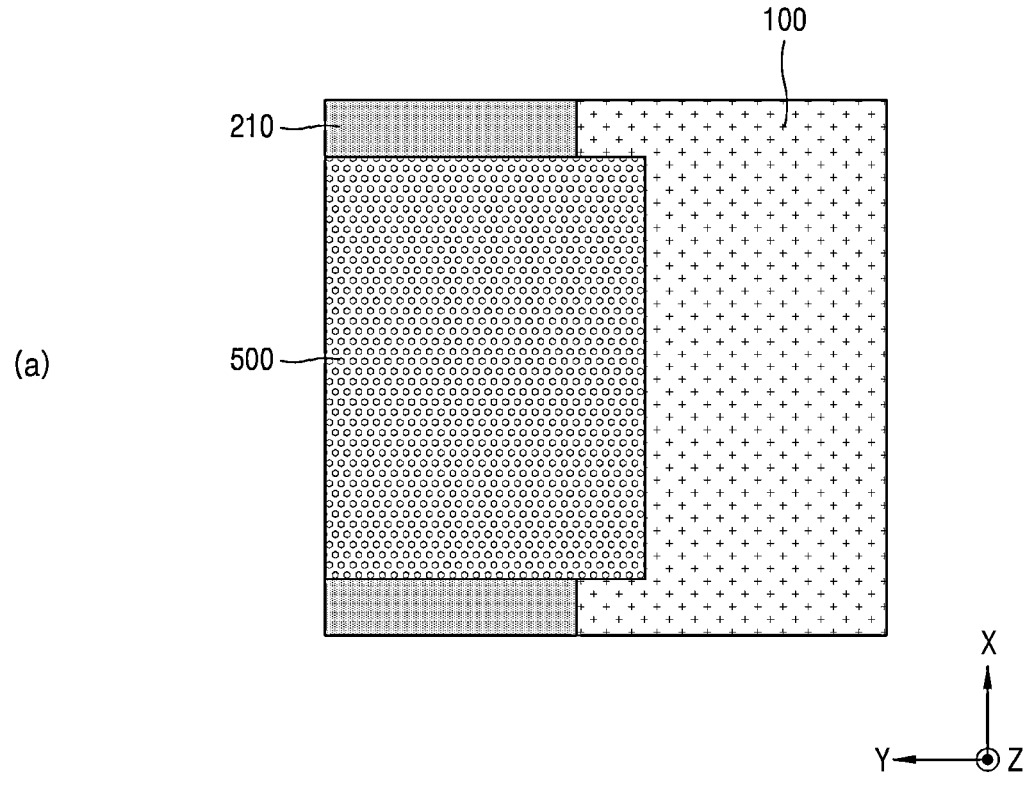
Figure 7:
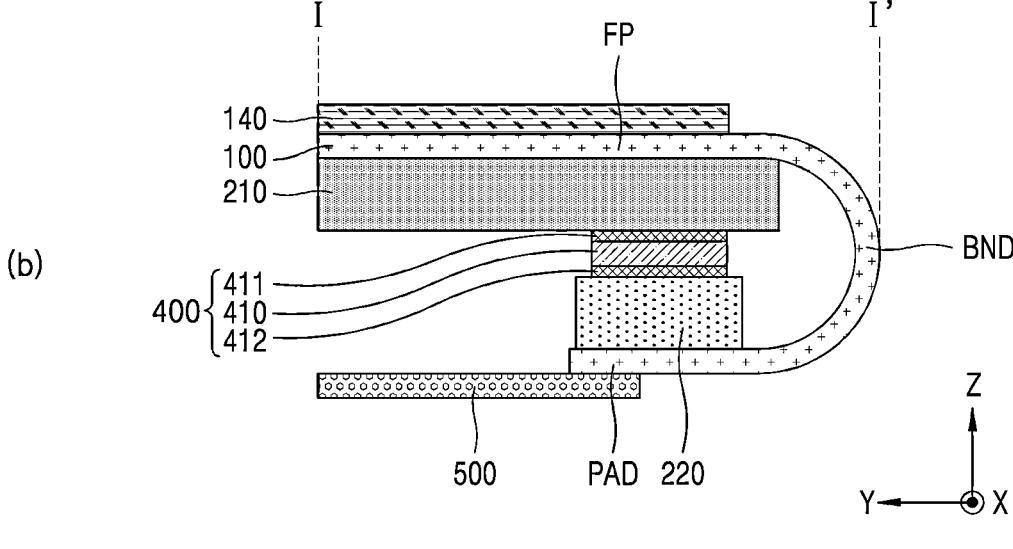

Referring to (a) and (b) in FIG. 7, the second plate 220 may be disposed under the second connection member 400 by bending the display panel 100 from the spacer 101 of the display panel 100 toward the back face of the display panel 100.

The second plate 220 may be fixed to the second connection member 400 via the second adhesive layer 412 of the second connection member 400.

Accordingly, the display apparatus 1 may include the display panel 100 having the front portion FP, the bent portion BND, and the pad portion PAD bent from the bent portion BND so as to be positioned on a back face of the front portion FP, the first plate 210 disposed between the front portion FP and the pad portion PAD, and disposed below the front portion FP, and the second plate 220 disposed between the front portion FP and the pad portion PAD, and disposed on a top face of the pad portion PAD and including the transparent area.

The flexible circuit board 500 may be connected to a distal end of a bottom of the pad portion PAD of the display panel 100, and the flexible circuit board 500 may be disposed to vertically overlap the second plate 220 including the transparent area.

Figure 8A:
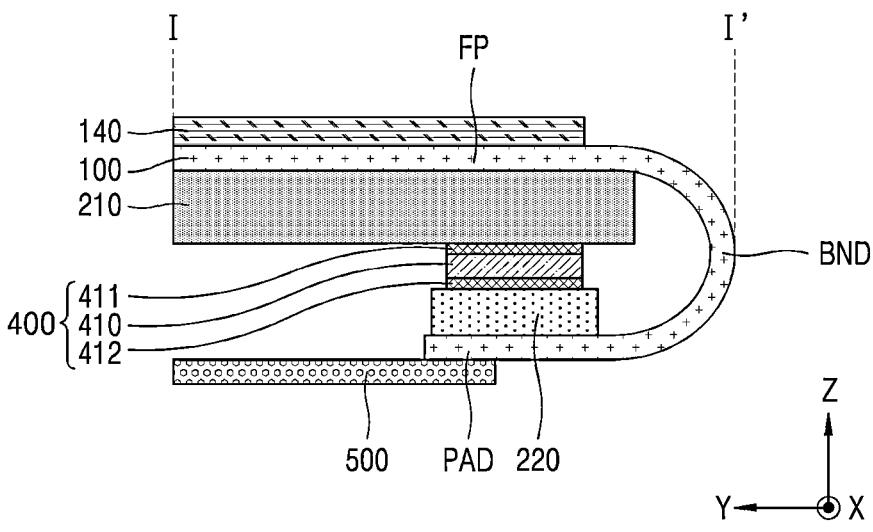
FIG. 8A and FIG. 8B are cross-sectional views of display apparatuses according to various embodiments of the present disclosure.
Figure 8B:
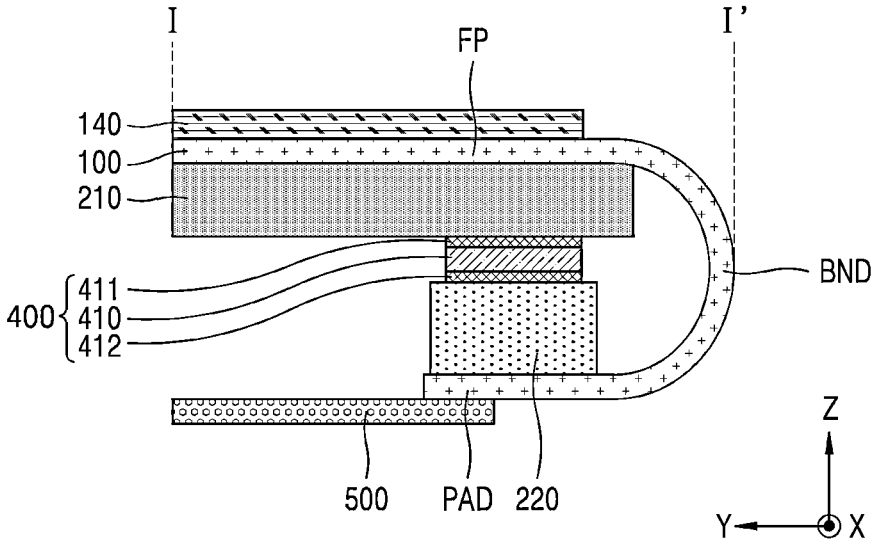

FIG. 8A and FIG. 8B are cross-sectional views of display apparatuses according to various embodiments of the present disclosure.

FIG. 8A shows an embodiment in which a thickness of the second plate 220 of the display apparatus 1 according to the embodiment of the present disclosure shown in (b) of FIG. 7 is further reduced. FIG. 8B shows an embodiment in which the thickness of the second plate 220 of the display apparatus 1 according to the embodiment of the present disclosure shown in (b) of FIG. 7 is further increased.

As in the embodiments shown in FIG. 8A and FIG. 8B, the thickness of the second plate 220 may be controlled such that a total thickness of the display apparatus 1 may be easily adjusted. Thus, a slimmer display apparatus 1 may be easily implemented.

Further, when the thickness of the second plate 220 is adjusted, a size of the bent portion BND may be adjusted, such that the display apparatus 1 with a reduced bezel area may be easily implemented.

In this way, according to the embodiments of the present disclosure, the thicknesses of the first plate 210 and the second plate 220 may be different, and the thickness of the second plate 220 may be adjusted, thereby easily implementing the display apparatus 1 having the thickness of the device and the thickness of the bezel area as desired by the user.

FIG. 9 to FIG. 12 are process diagrams for a method for manufacturing a display apparatus according to another embodiment of the present disclosure. Differences thereof from the method for manufacturing the display apparatus according to the embodiment of the present disclosure described with reference to FIGS. 4 to 7 will be mainly described, and the same contents may be omitted.

In FIGS. 9 to 12, (a) is a back face view of the process diagram for the method for manufacturing the display apparatus, and (b) is a cross-sectional view thereof.

Figure 9:
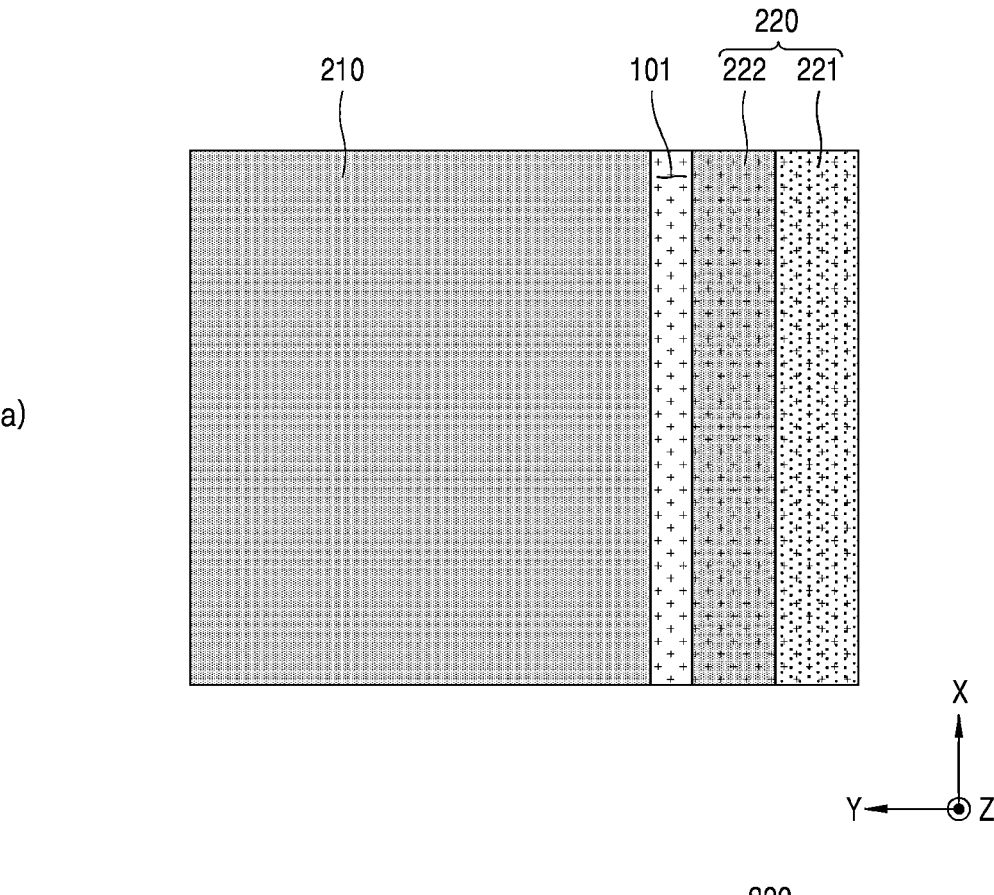
FIGS. 9 to 12 are process diagrams of a method for manufacturing a display apparatus according to another embodiment of the present disclosure.
Figure 9:
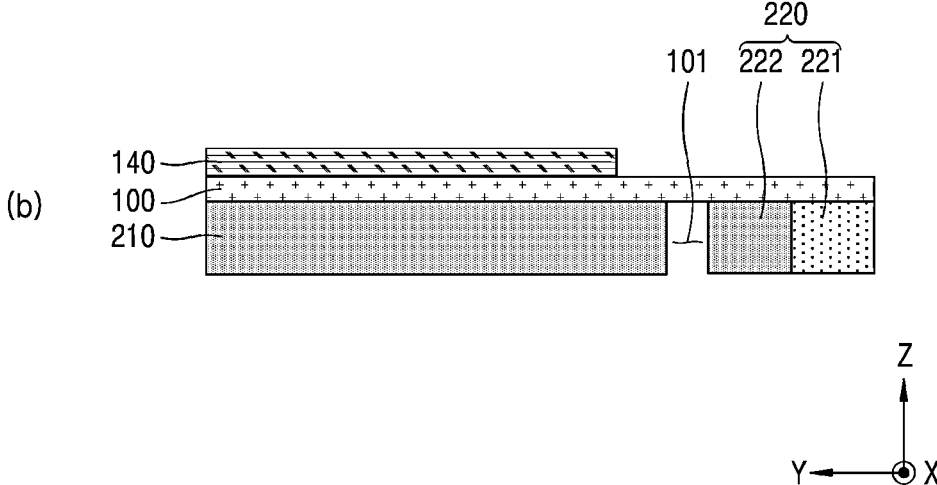

Referring to (a) and (b) in FIG. 9, the polarizing plate 140 may be formed on the top face as one face of the display panel 100, and the first plate 210 and the second plate 220 may be formed on the bottom face as the other face of the display panel 100.

The first plate 210 and the second plate 220 may be formed to be spaced from each other so that the spacer 101 is defined therebetween.

The first plate 210 may be disposed to vertically overlap with the polarizing plate 140, and the second plate 220 may be disposed not to vertically overlap with the polarizing plate 140.

The first plate 210 may be disposed to vertically overlap the polarizing plate 140 and may have an area substantially corresponding to the display area.

Therefore, the first plate 210 and the second plate 220 may have different areas. The first plate 210 may be formed to have a larger area than that of the second plate 220.

The first plate 210 and the second plate 220 may be formed in the same layer based on the other face of the display panel 100.

The first plate 210 and the second plate 220 may be fixed to the other face of the display panel 100 via an adhesive layer as a separate adhesive member.

The first plate 210 may include the conductive metal 310 and the porous member 300 including the plurality of pores 320 positioned inside the conductive metal 310 to increase the stiffness of the display apparatus 1.

The second plate 220 may include a transparent area 221 and a non-transparent area 222.

The transparent area 221 and the non-transparent area 222 of the second plate 220 may be made of different materials.

The transparent area 221 of the second plate 220 may include a transparent material.

For example, a portion of the second plate 220 corresponding to the transparent area 221 may include one or more of polyethylene terephthalate (PET), polyimide (PI), and polyethylene naphthalate (PEN). The present disclosure is not limited thereto.

Further, a portion of the second plate 220 corresponding to the non-transparent area 222 may include the porous member 300 including the conductive metal 310 including a non-transparent material, and a plurality of pores 320 positioned inside the conductive metal 310.

The transparent area 221 of the second plate 220 is closer to an outer edge of the display panel 100 than the non-transparent area 222 thereof is. The transparent area 221 of the second plate 220 may act as an outer area, while the non-transparent area 222 thereof may act as the outer area. The non-transparent area 222 of the second plate 220 may be formed between the first plate 210 and the transparent area 221 of the second plate 220.

Thus, the second plate 220 may be formed in a complex structure including both the transparent area 221 and the non-transparent area 222, and the non-transparent area 222 may include the porous member 300.

Therefore, the display apparatus 1 according to the embodiment of the present disclosure has a complex structure having the first plate 210 including the porous member 300 and the second plate 220 partially including the porous member 300. Thus, a total area of the device including the porous member 300 may be increased, the stiff stiffness of the display apparatus 1 may be further improved.

Figure 10:
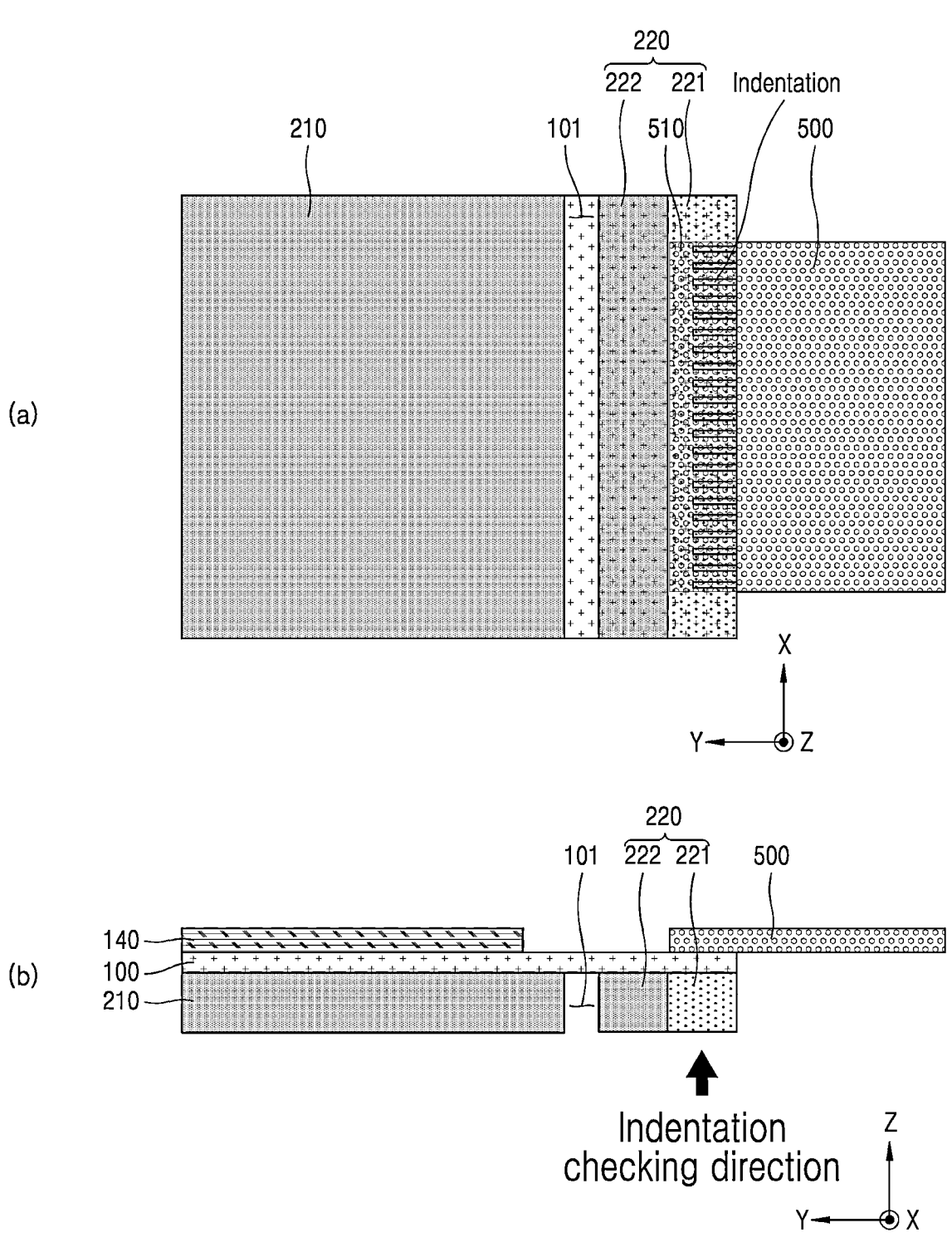

Referring to (a) and (b) in FIG. 10, the flexible circuit board 500 may be electrically connected to the display panel 100 and be fixed thereto and at the distal end of the top face of the display panel 100 opposite to the other face of the display panel 100 on which the second plate 220 is placed.

In this case, the flexible circuit board 500 may be disposed to vertically overlap the transparent area 221 of the second plate 220 and not to vertically overlap the non-transparent area 222 of the second plate 220.

According to the embodiment of the present disclosure, the second plate 220 includes the transparent area 221 made of a transparent material and the flexible circuit board 500 may be disposed to vertically overlap the transparent area 221. Thus, one or more indentations may be formed at an interface between the flexible circuit board 500 and the bottom surface of the display panel 100, and the overlapping area 510 between the display panel 100 and the flexible circuit board 500 may be identified through the second plate 220 from below the second plate 220. Thus, whether or not the indentation has occurred in the overlapping area 510 may be easily identified.

Thus, according to the embodiment of the present disclosure, the second plate 220 including the transparent area 221 may be disposed on a portion of the back face of the display panel 100 corresponding to the distal end of the top face of the display panel 100 to which the flexible circuit board 500 is connected. Thus, a process operator may easily identify whether the indentation in the overlapping area of the flexible circuit board 500 and the display panel 100 has occurred through the transparent area 221 of the second plate 220.

Accordingly, the process operator may easily identify whether the flexible circuit board 500 and the display panel 100 are electrically connected to each other, based on the occurrence or non-occurrence of the indentation, thereby improving the productivity and reducing the occurrence of defects in the display apparatus 1 due to connection defects.

Figure 11:
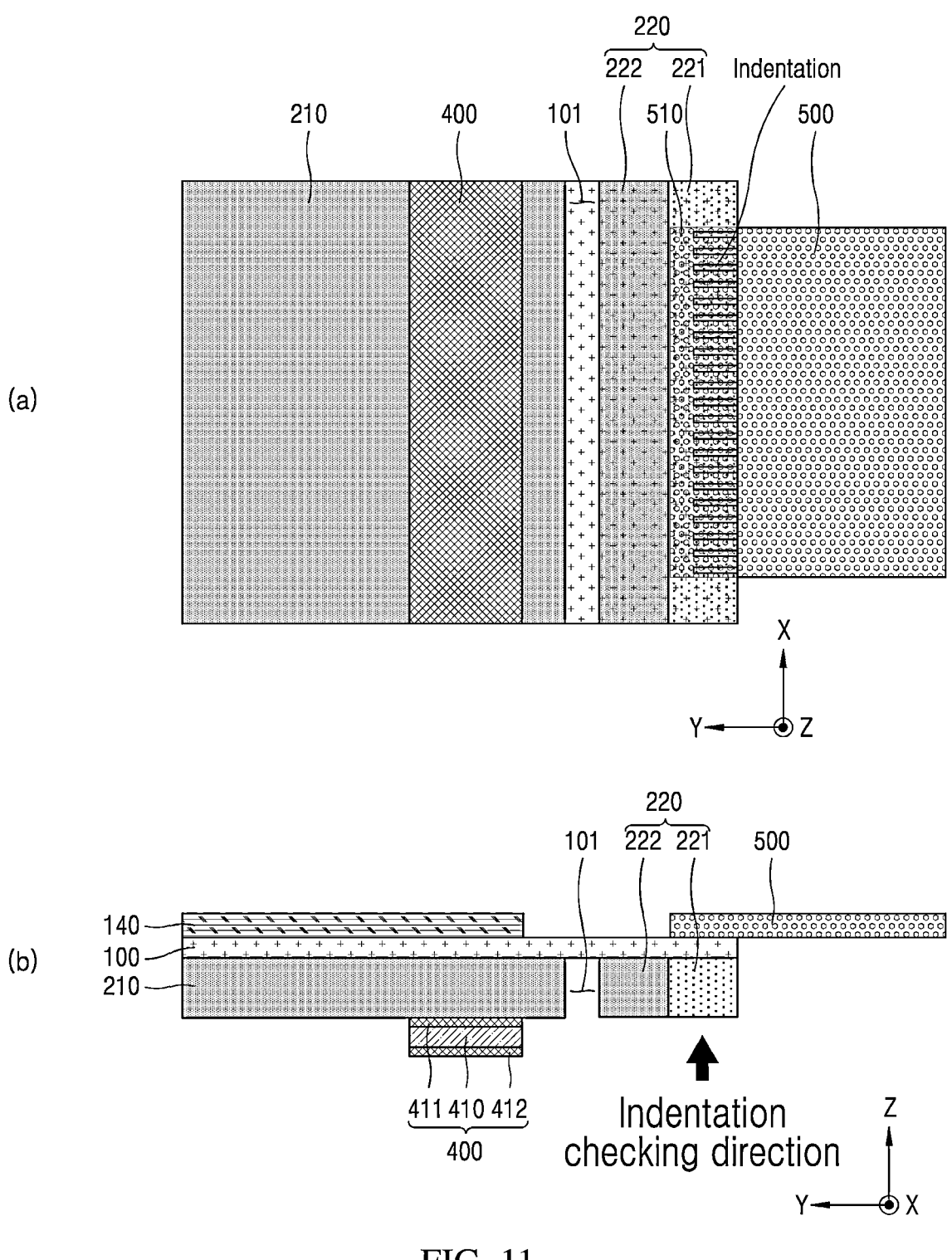

Referring to (a) and (b) in FIG. 11, the second connection member 400 may be formed on the back face of the first plate 210.

The second connection member 400 may include the base layer 410 and the first adhesive layer 411 and the second adhesive layer 412 respectively formed on both opposing faces of the base layer 410.

The second connection member 400 may be fixed to the first plate 210 via the first adhesive layer 411.

The second connection member 400 may be disposed at a position overlapping the second plate 220 disposed on the back face of the display panel 100 when the display panel 100 is bent.

Figure 12:
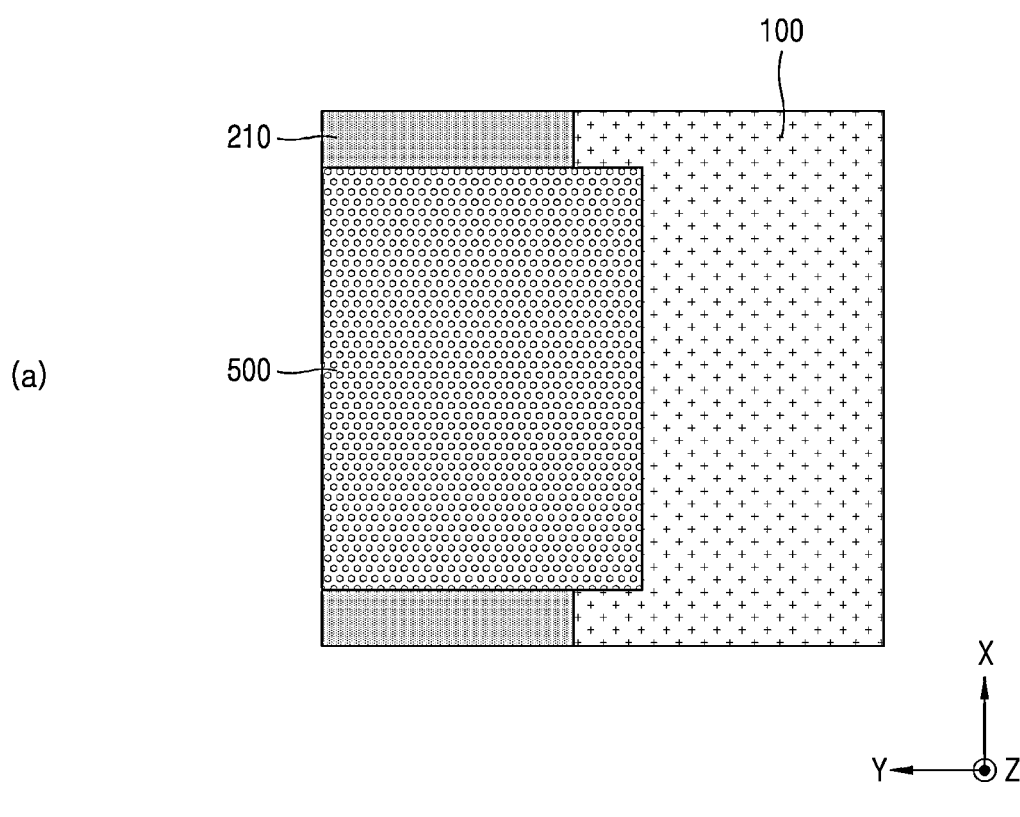
Figure 12:
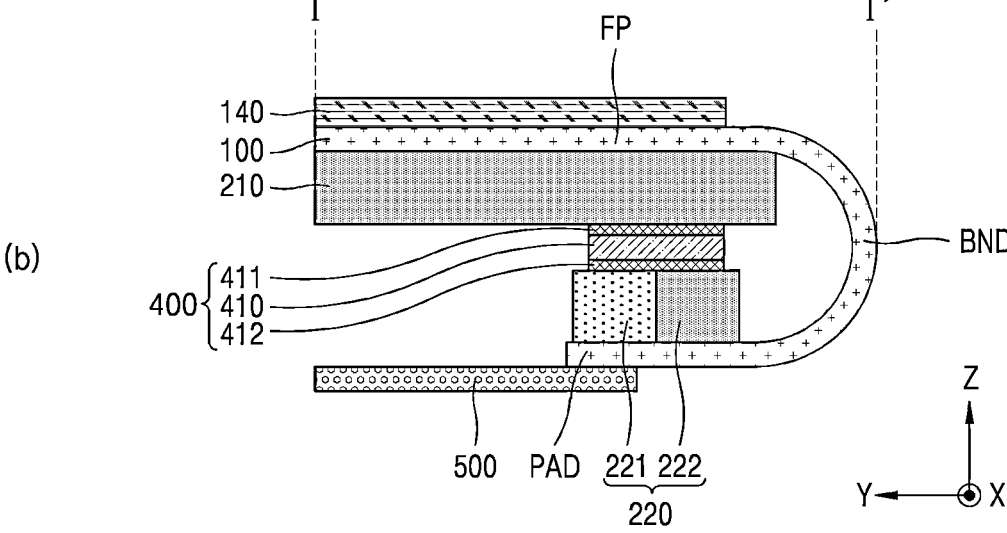

Referring to (a) and (b) in FIG. 12, the second plate 220 may be disposed under the second connection member 400 by bending the display panel 100 from the spacer 101 of the display panel 100 toward the back face of the display panel 100.

The second plate 220 may be fixed to the second connection member 400 via the second adhesive layer 412 of the second connection member 400.

Accordingly, the display apparatus 1 may include the display panel 100 having the front portion FP, the bent portion BND, and the pad portion PAD bent from the bent portion BND so as to be positioned on a back face of the front portion FP, the first plate 210 disposed between the front portion FP and the pad portion PAD, and disposed below the front portion FP, and the second plate 220 disposed between the front portion FP and the pad portion PAD, and disposed on a top face of the pad portion PAD and including the transparent area 221 and the non-transparent area 222.

The flexible circuit board 500 may be connected to a distal end of a bottom of the pad portion PAD of the display panel 100, and the flexible circuit board 500 may be disposed to vertically overlap the transparent area 221 of the second plate 220.

Figure 13A:
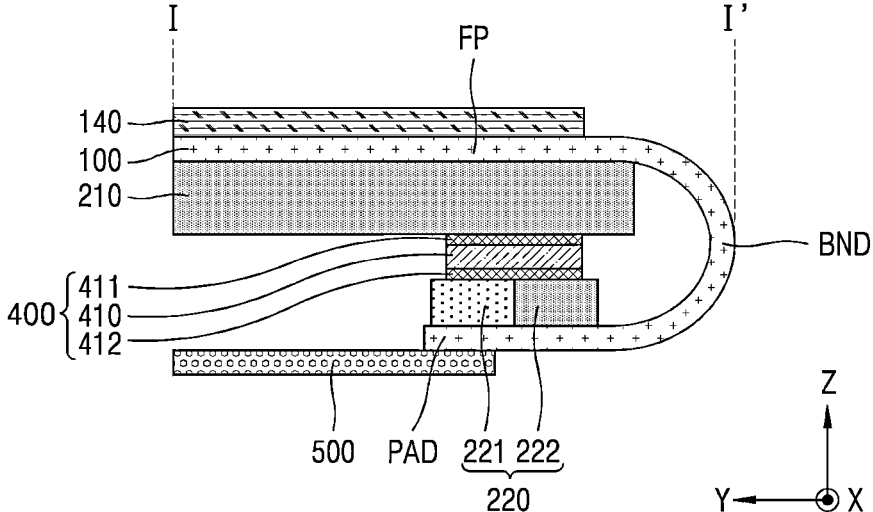
FIG. 13A and FIG. 13B are cross-sectional views of display apparatuses according to various embodiments of the present disclosure.
Figure 13B:
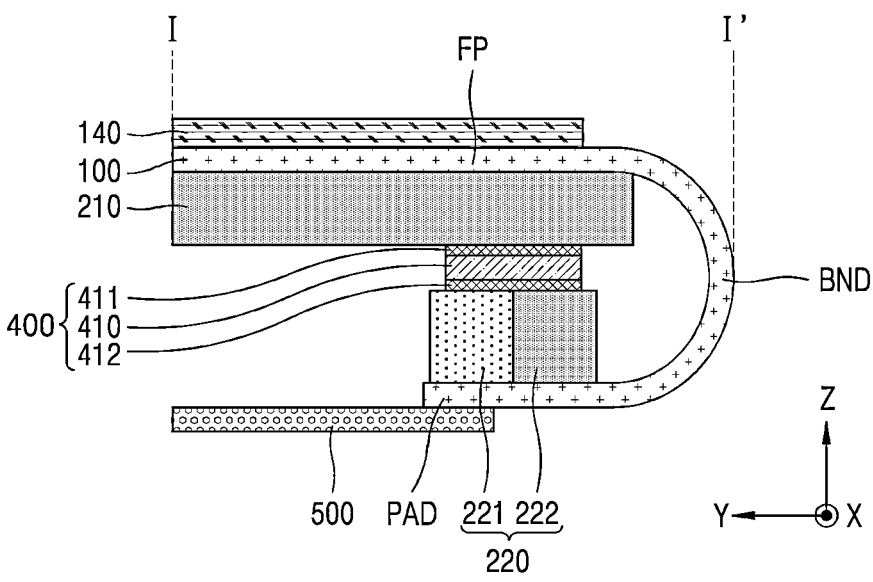

FIG. 13A and FIG. 13B are cross-sectional views of display apparatuses according to various embodiments of the present disclosure.

FIG. 13A shows an embodiment in which a thickness of the second plate 220 of the display apparatus 1 according to the embodiment of the present disclosure shown in (b) of FIG. 12 is further reduced. FIG. 13B shows an embodiment in which the thickness of the second plate 220 of the display apparatus 1 according to the embodiment of the present disclosure shown in (b) of FIG. 12 is further increased.

As in the embodiments shown in FIG. 13A and FIG. 13B, the thickness of the second plate 220 may be controlled such that a total thickness of the display apparatus 1 may be easily adjusted. Thus, a slimmer display apparatus 1 may be easily implemented.

Further, when the thickness of the second plate 220 is adjusted, a size of the bent portion BND may be adjusted, such that the display apparatus 1 with a reduced bezel area may be easily implemented.

In this way, according to the embodiments of the present disclosure, the thicknesses of the first plate 210 and the second plate 220 may be different, and the thickness of the second plate 220 may be adjusted, thereby easily implementing the display apparatus 1 having the thickness of the device and the thickness of the bezel area as desired by the user.

Figure 14:
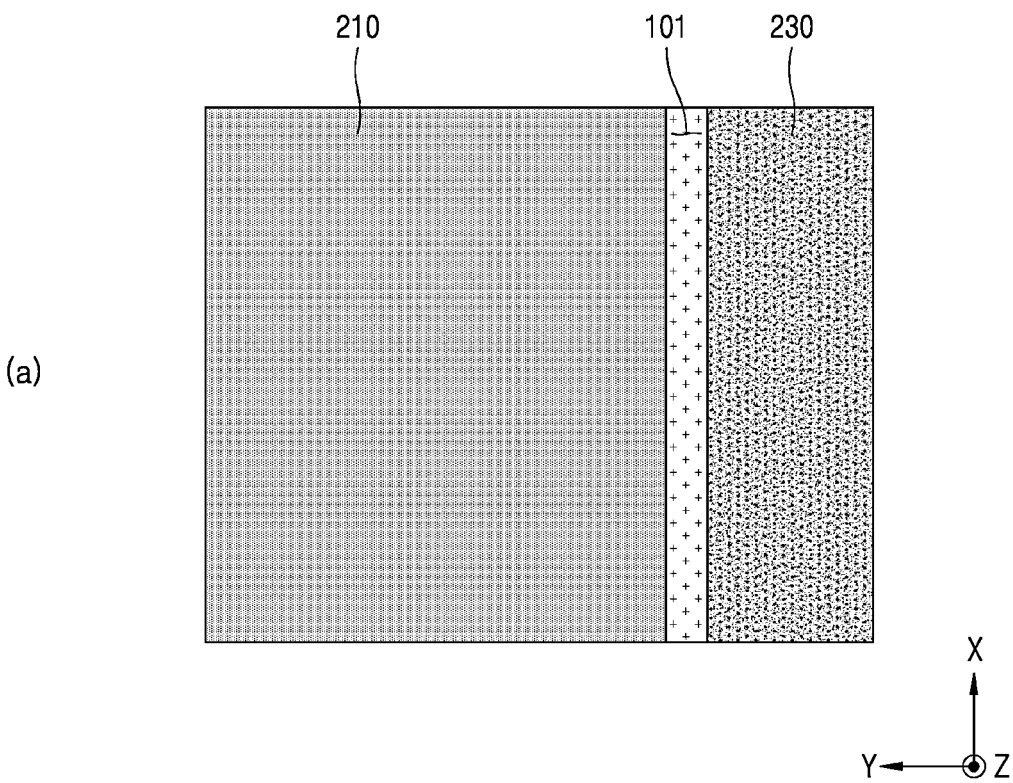
FIGS. 14 to 16 are process diagrams of a method for manufacturing a display apparatus according to still another embodiment of the present disclosure.
Figure 14:
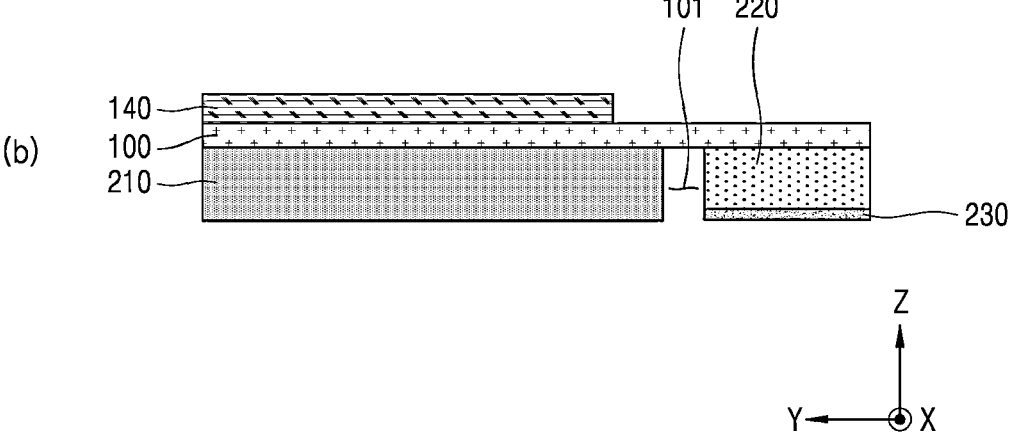
Figure 15:
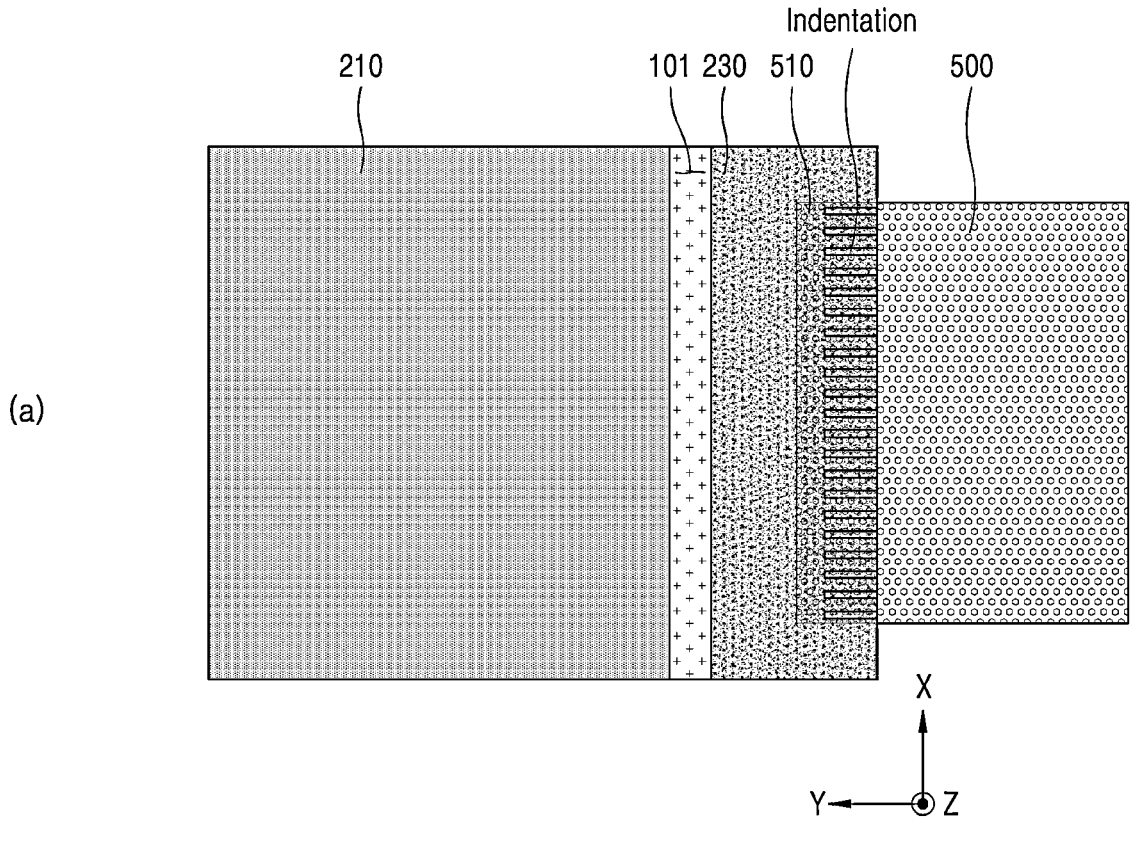
Figure 15:
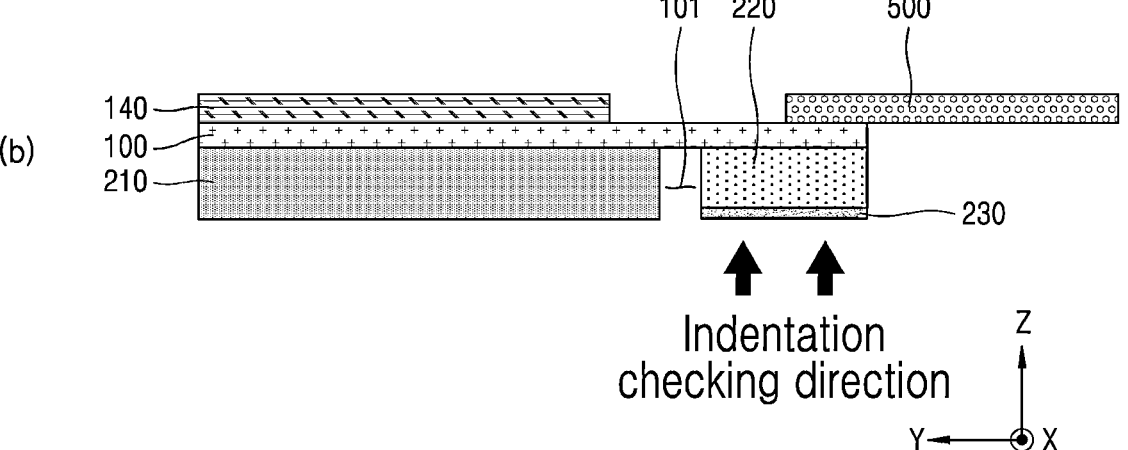
Figure 16:
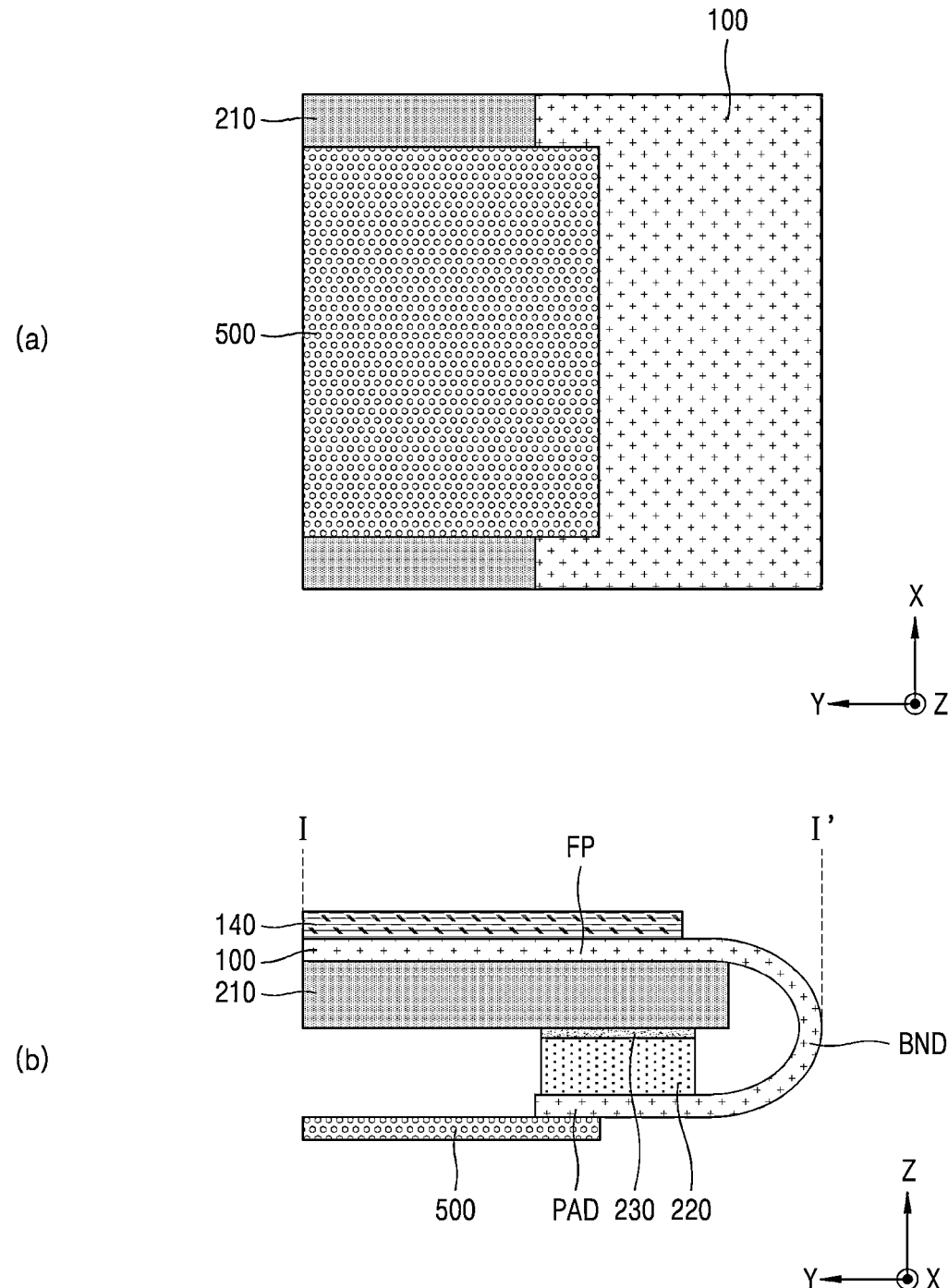

FIG. 14 to FIG. 16 are process diagrams for a method for manufacturing a display apparatus according to still another embodiment of the present disclosure. Differences thereof from the method for manufacturing the display apparatus according to the embodiment of the present disclosure described with reference to FIGS. 4 to 7 will be mainly described, and the same contents may be omitted.

In FIGS. 14 to 16, (a) is a back face view of the process diagram for the method for manufacturing the display apparatus, and (b) is a cross-sectional view thereof.

Referring to (a) and (b) in FIG. 14, the polarizing plate 140 may be formed on the top face as one face of the display panel 100, and the first plate 210 and the second plate 220 may be formed on the bottom face as the other face of the display panel 100.

The first plate 210 and the second plate 220 may be formed to be spaced from each other so that the spacer 101 is defined therebetween.

The first plate 210 may be disposed to vertically overlap with the polarizing plate 140, and the second plate 220 may be disposed not to vertically overlap with the polarizing plate 140.

The first plate 210 may be disposed to vertically overlap the polarizing plate 140 and may have an area substantially corresponding to the display area.

Therefore, the first plate 210 and the second plate 220 may have different areas. The first plate 210 may be formed to have a larger area than that of the second plate 220.

The first plate 210 and the second plate 220 may be formed in the same layer based on the other face of the display panel 100.

The first plate 210 and the second plate 220 may be fixed to the other face of the display panel 100 via an adhesive layer as a separate adhesive member.

The first plate 210 may include the conductive metal 310 and the porous member 300 including the plurality of pores 320 positioned inside the conductive metal 310 to increase the stiffness of the display apparatus 1.

The second plate 220 may include a transparent material. An entire area thereof may be formed as a transparent area.

For example, the second plate 220 may include one or more of polyethylene terephthalate (PET), polyimide (PI), and polyethylene naphthalate (PEN). The present disclosure is not limited thereto.

Further, a second plate adhesive layer 230 may be disposed on a bottom face of the second plate 220.

The second plate adhesive layer 230 may include an adhesive material having a transparent material.

For example, the adhesive material of the second plate adhesive layer 230 may include one or more of OCA (Optical Clear adhesive), OCR (Optical Clear Resin), and PSA (Pressure Sensitive Adhesive).

Thus, according to an embodiment of the present disclosure, both the second plate 220 and the second plate adhesive layer 230 may be made of a transparent material.

Referring to (a) and (b) in FIG. 15, the flexible circuit board 500 may be electrically connected to the display panel 100 and fixed thereto and at a distal end of the top face as one face of the display panel 100 opposite to the other face of the display panel 100 on which the second plate 220 is disposed.

In this case, the flexible circuit board 500 may be disposed to vertically and at least partially overlap the second plate 220 made of the transparent material.

According to the embodiment of the present disclosure, the second plate 220 includes the transparent area. The flexible circuit board 500 may be disposed to vertically and at least partially overlap the transparent area. According to an embodiment of the present disclosure, the second plate 220 includes the transparent material such that the entire area of the second plate 220 may be a transparent area. Therefore, one or more indentations may be formed at an interface between the flexible circuit board 500 and the display panel 100, and the overlapping area 510 between the flexible circuit board 500 and the display panel 100 and may be identified through the second plate 220 from a position below the plate 220. Whether or not indentation occurs in the overlapping area 510 may be easily identified.

Further, the second plate adhesive layer 230 may be made of a transparent material. Thus, the presence of the adhesive layer 230 may not interfere with identifying the indentation.

Thus, according to the embodiment of the present disclosure, the second plate 220 including the transparent area is disposed on a portion of the back face of the display panel 100 corresponding to the distal end of the top face of the display panel 100 to which the flexible circuit board 500 is connected. Thus, a process operator may easily identify whether the indentation in the overlapping area of the flexible circuit board 500 and the display panel 100 has occurred through the transparent area of the second plate 220.

Accordingly, the process operator may easily identify whether the flexible circuit board 500 and the display panel 100 are electrically connected to each other, based on the occurrence or non-occurrence of the indentation, thereby improving the productivity and reducing the occurrence of defects in the display apparatus 1 due to connection defects.

Referring to (a) and (b) in FIG. 16, the second plate 220 may be disposed under the first plate 210 by bending the display panel 100 from the spacer 101 of the display panel 100 toward the back face of the display panel 100.

The second plate 220 may be fixed to the first plate 210 via the second plate adhesive layer 230.

Therefore, the second plate 220 may directly contact the first plate 210 via the second plate adhesive layer 230.

Therefore, according to the embodiment of the present disclosure, the process of forming the separate connection member having adhesiveness for fixing the second plate 220 and the first plate 210 to each other may be omitted, so that the efficiency of the process may be obtained.

Further, the separate connection member having the adhesive property may have a structure in which an adhesive layer is formed on each of both opposing faces of the base layer. According to this embodiment of the present disclosure, the second plate 220 may serve as a base layer supporting the second plate adhesive layer 230. Thus, there is no need for the separate additional base layer, such that the thickness of the display apparatus 1 may be greatly reduced.

Accordingly, the display apparatus 1 may include the display panel 100 having the front portion FP, the bent portion BND, and the pad portion PAD bent from the bent portion BND so as to be positioned on a back face of the front portion FP, the first plate 210 disposed between the front portion FP and the pad portion PAD, and disposed below the front portion FP, and the second plate 220 disposed between the front portion FP and the pad portion PAD, and disposed on the top face of the pad portion PAD and including the transparent area.

The flexible circuit board 500 may be connected to a distal end of a bottom of the pad portion PAD of the display panel 100, and the flexible circuit board 500 may be disposed to vertically and at least partially overlap the second plate 220 including the transparent area.

Figure 17:
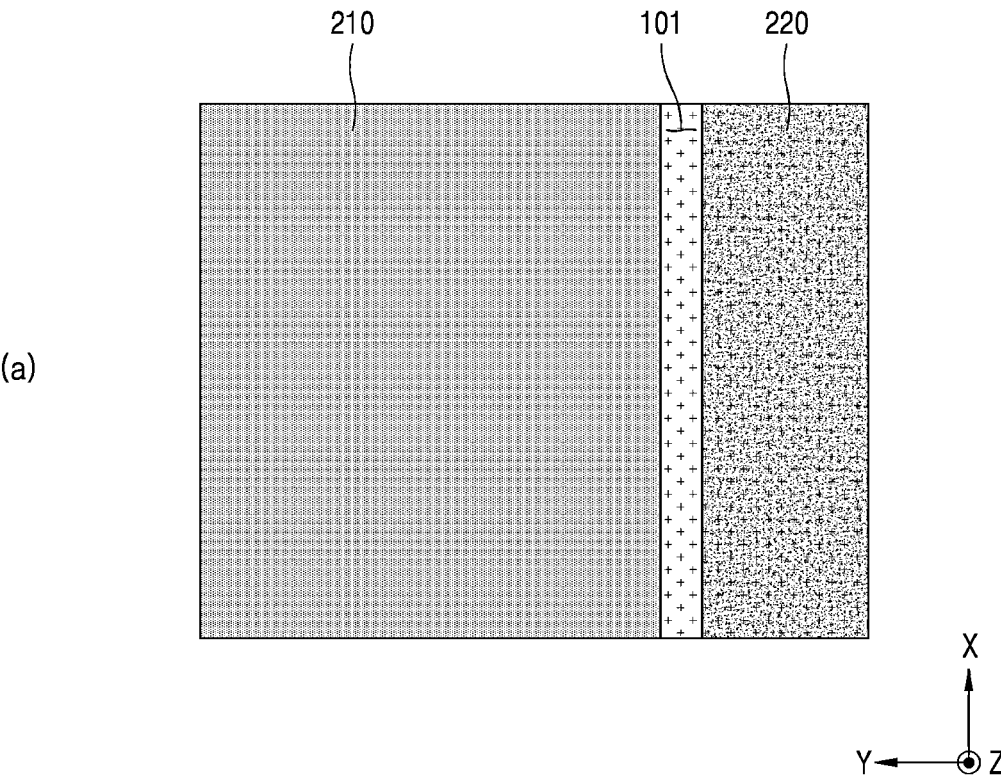
FIG. 17 to FIG. 19 are process diagrams for a method for manufacturing a display apparatus according to still yet another embodiment of the present disclosure.
Figure 17:
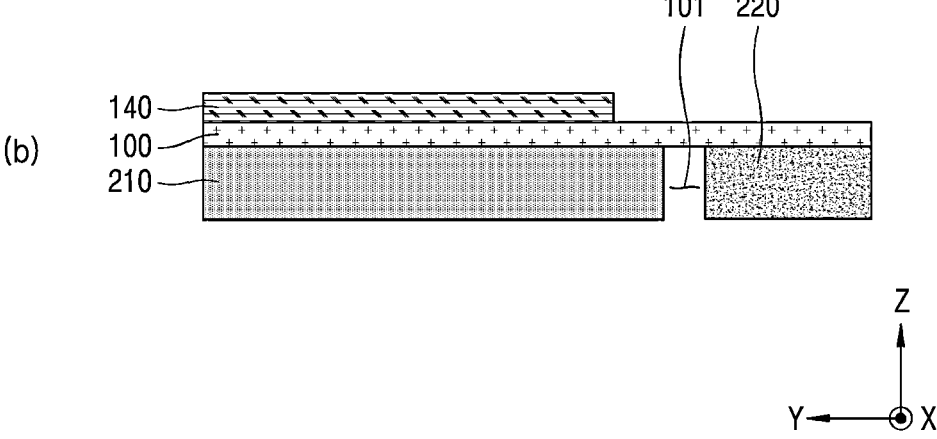
Figure 18:
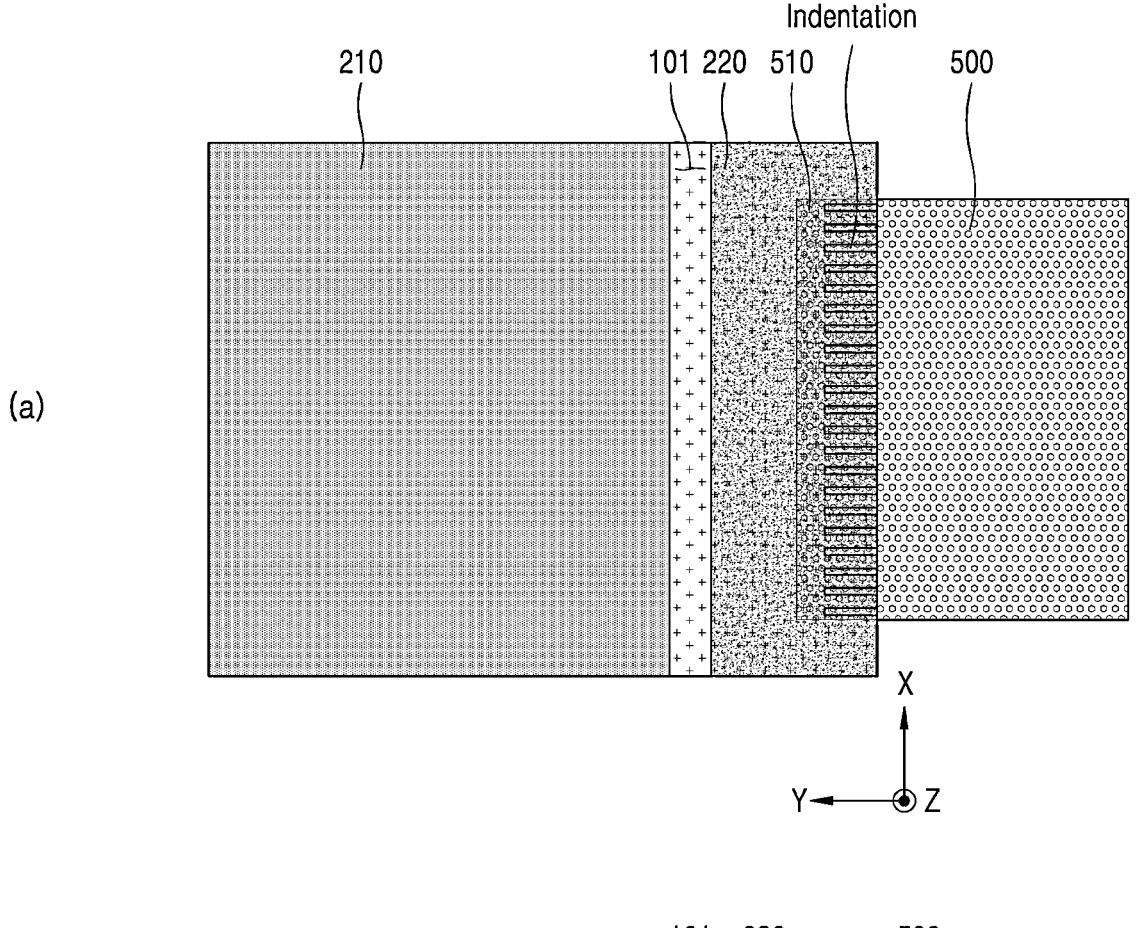
Figure 18:
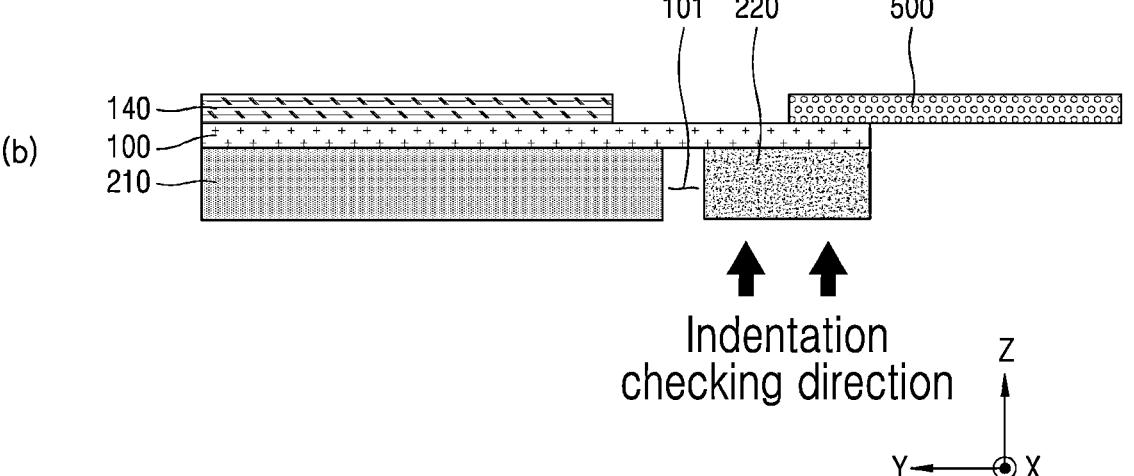
Figure 19:
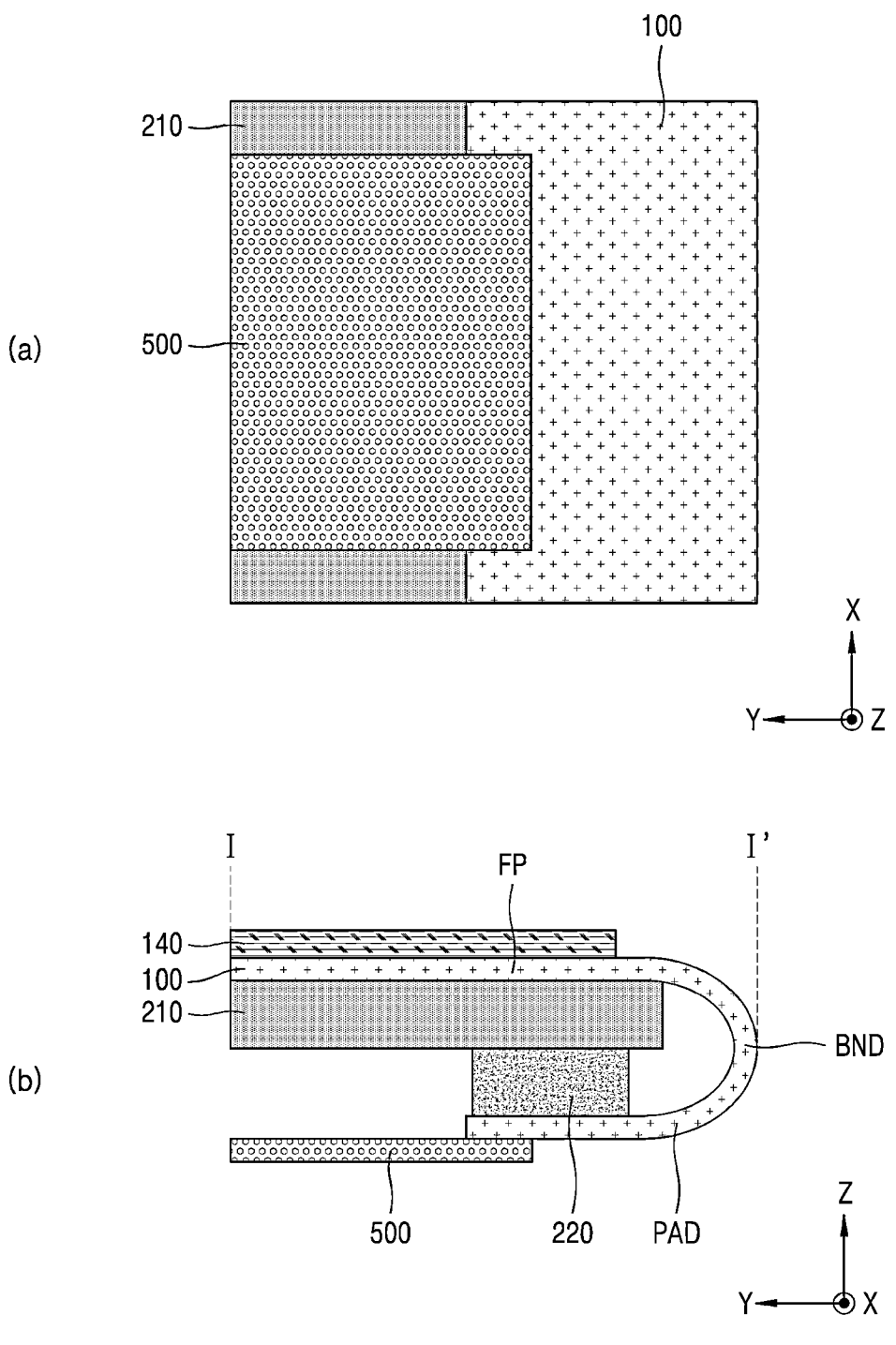

FIG. 17 to FIG. 19 are process diagrams for a method for manufacturing a display apparatus according to still yet another embodiment of the present disclosure. Differences thereof from the method for manufacturing the display apparatus according to the embodiment of the present disclosure described with reference to FIGS. 4 to 7 will be mainly described, and the same contents may be omitted.

In FIGS. 17 to 19, (a) is a back face view of the process diagram for the method for manufacturing the display apparatus, and (b) is a cross-sectional view thereof.

Referring to (a) and (b) in FIG. 17, the polarizing plate 140 may be formed on the top face as one face of the display panel 100, and the first plate 210 and the second plate 220 may be formed on the bottom face as the other face of the display panel 100.

The first plate 210 and the second plate 220 may be formed to be spaced from each other so that the spacer 101 is defined therebetween.

The first plate 210 may be disposed to vertically overlap with the polarizing plate 140, and the second plate 220 may be disposed not to vertically overlap with the polarizing plate 140.

The first plate 210 may be disposed to vertically overlap the polarizing plate 140 and may have an area substantially corresponding to the display area.

Therefore, the first plate 210 and the second plate 220 may have different areas. The first plate 210 may be formed to have a larger area than that of the second plate 220.

The first plate 210 and the second plate 220 may be formed in the same layer based on the other face of the display panel 100.

The first plate 210 and the second plate 220 may be fixed to the other face of the display panel 100 via an adhesive layer as a separate adhesive member.

The first plate 210 may include the conductive metal 310 and the porous member 300 including the plurality of pores 320 positioned inside the conductive metal 310 to increase the stiffness of the display apparatus 1.

The second plate 220 may include the transparent material. The entire area thereof may be formed as a transparent area.

For example, the second plate 220 may include an adhesive material having a transparent property.

For example, the adhesive material of the second plate 220 may include one or more of polyethylene terephthalate (PET), polyimide (PI), and polyethylene naphthalate (PEN). The present disclosure is not limited thereto.

Further, the second plate 220 may be made of an elastic foam PSA (Pressure Sensitive Adhesive) or a heat-dissipating PSA (Pressure Sensitive Adhesive).

Accordingly, when bending the display panel 100, the second plate 220 may have the rigidity against the bending pressure. The second plate may include a filler with a heat-dissipation function and thus may exhibit the heat-dissipation effect.

Thus, the second plate 220 according to an embodiment of the present disclosure may be made of a transparent material having adhesive properties.

In this case, the second plate 220 may be formed to have the same or similar thickness as or to that of the first plate 210.

Referring to (a) and (b) in FIG. 18, the flexible circuit board 500 may be electrically connected to the display panel 100 and fixed thereto and at a distal end of the top face as one face of the display panel 100 opposite to the other face of the display panel 100 on which the second plate 220 is disposed.

In this case, the flexible circuit board 500 may be disposed to vertically and at least partially overlap the second plate 220 made of the transparent material.

According to the embodiment of the present disclosure, the second plate 220 includes the transparent area. The flexible circuit board 500 may be disposed to vertically and at least partially overlap the transparent area. According to an embodiment of the present disclosure, the second plate 220 includes the transparent material such that the entire area of the second plate 220 may be a transparent area. Therefore, one or more indentations may be formed at an interface between the flexible circuit board 500 and the display panel 100, and the overlapping area 510 between the flexible circuit board 500 and the display panel 100 and may be identified through the second plate 220 from a position below the plate 220. Whether or not indentation occurs in the overlapping area 510 may be easily identified.

Thus, according to the embodiment of the present disclosure, the second plate 220 including the transparent area is disposed on a portion of the back face of the display panel 100 corresponding to the distal end of the top face of the display panel 100 to which the flexible circuit board 500 is connected. Thus, a process operator may easily identify whether the indentation in the overlapping area of the flexible circuit board 500 and the display panel 100 has occurred through the transparent area of the second plate 220.

Accordingly, the process operator may easily identify whether the flexible circuit board 500 and the display panel 100 are electrically connected to each other, based on the occurrence or non-occurrence of the indentation, thereby improving the productivity and reducing the occurrence of defects in the display apparatus 1 due to connection defects.

Referring to (a) and (b) in FIG. 19, the second plate 220 may be disposed under the first plate 210 by bending the display panel 100 from the spacer 101 of the display panel 100 toward the back face of the display panel 100.

Since the second plate 220 itself is made of adhesive material, a separate adhesive layer for fixing the first plate 210 and the second plate 220 to each other may not be required.

Therefore, the second plate 220 may be fixed to and in direct contact with the first plate 210.

Therefore, according to the embodiment of the present disclosure, the process of forming the separate connection member having adhesiveness for fixing the second plate 220 and the first plate 210 to each other may be omitted, so that the efficiency of the process may be obtained.

Further, the separate connection member having the adhesive property may have a structure in which an adhesive layer is formed on each of both opposing faces of the base layer. According to this embodiment of the present disclosure, the second plate 220 may serve as the plate and at the same time, as a connecting member with double-sided adhesiveness. Thus, there is no need for the separate additional connection member, such that the thickness of the display apparatus 1 may be greatly reduced.

Accordingly, the display apparatus 1 may include the display panel 100 having the front portion FP, the bent portion BND, and the pad portion PAD bent from the bent portion BND so as to be positioned on a back face of the front portion FP, the first plate 210 disposed between the front portion FP and the pad portion PAD, and disposed below the front portion FP, and the second plate 220 disposed between the front portion FP and the pad portion PAD, and disposed on the top face of the pad portion PAD and including the transparent area.

The flexible circuit board 500 may be connected to a distal end of a bottom of the pad portion PAD of the display panel 100, and the flexible circuit board 500 may be disposed to vertically and at least partially overlap the second plate 220 including the transparent area.

A display apparatus according to the embodiments of the present disclosure as described above may include a display panel including a front portion, a bent portion, and a pad portion bent from the bent portion and positioned under the front portion; a first plate disposed between the front portion and the pad portion and disposed under the front portion; and a second plate disposed between the front portion and the pad portion and disposed on a top face of the pad portion, wherein the first plate includes a porous member, wherein the second plate includes a transparent area.

In one implementation of the device, the device further comprises a flexible circuit board connected to a distal end of a bottom of the pad portion, wherein the flexible circuit board at least partially and vertically overlap the transparent area.

In one implementation of the device, the porous member includes a conductive metal and a plurality of pores formed inside the conductive metal.

In one implementation of the device, the second plate includes at least one of polyethylene terephthalate (PET), polyimide (PI), or polyethylene naphthalate (PEN).

In one implementation of the device, the device further comprises a connection member disposed between the first plate and the second plate.

In one implementation of the device, thicknesses of the first plate and the second plate are different from each other.

In one implementation of the device, the second plate further includes a non-transparent area, wherein the non-transparent area includes a porous member, wherein the flexible circuit board vertically non-overlap the non-transparent area.

In one implementation of the device, the first plate has a larger area size than an area size of the second plate.

In one implementation of the device, the second plate includes a second plate adhesive layer disposed on one face thereof, wherein the second plate is fixed to the first plate via the second plate adhesive layer.

In one implementation of the device, the second plate is made of an adhesive material, wherein the adhesive material includes at least one of OCA (Optical Clear Adhesive), OCR (Optical Clear Resin), or PSA (Pressure Sensitive Adhesive).

In one implementation of the device, the second plate is in direct contact with the first plate.

A method for manufacturing a display apparatus according to the embodiments of the present disclosure as described above may include providing a display panel; positioning first and second plates having different areas on a back face of the display panel, wherein the second plate includes a transparent area; forming a spacer between the first plate and the second plate; connecting a flexible circuit board to a distal end of a top face of the display panel such that the flexible circuit board vertically and at least partially overlaps the transparent area of the second plate; and bending the second plate from the spacer toward the back face of the display panel such that the second plate positioned under the first plate.

In one implementation of the method, the method further comprises forming a connection member on a back face of the first plate, wherein the second plate is fixed to the first plate via the connection member.

In one implementation of the method, the second plate further includes a non-transparent area, wherein the non-transparent area includes a porous member, wherein the flexible circuit board is connected to the display panel such that the flexible circuit board vertically non-overlaps the non-transparent area. In one implementation of the method, the first plate is formed to have a larger area size than an area size of the second plate.

In one implementation of the method, the first plate includes a porous member, wherein the porous member includes a conductive metal and a plurality of pores formed inside the conductive metal.

In one implementation of the method, the second plate includes a second plate adhesive layer disposed on one face thereof, wherein the second plate is fixed to and in direct contact with the first plate via the second plate adhesive layer.

In one implementation of the method, the second plate is made of an adhesive material, wherein the adhesive material includes at least one of OCA (Optical Clear adhesive), OCR (Optical Clear Resin), or PSA (Pressure Sensitive Adhesive), wherein the second plate is fixed to and is in direct contact with the first plate.

Although the embodiments of the present disclosure have been described above in more detail with reference to the accompanying drawings, the present disclosure is not necessarily limited to the embodiments, and various modifications may be made within the scope that does not deviate from the technical spirit of the present disclosure. Therefore, the embodiments as disclosed in the present disclosure are to illustrate the disclosure rather than limiting the technical idea of the present disclosure, and the scope of the technical idea of the present disclosure is not limited to the embodiments. Therefore, it should be understood that the embodiments as described above are illustrative in all respects and not restrictive. The protective scope of the present disclosure should be interpreted based on the claims, and all technical ideas within the scope equivalent thereto should be construed as being included in the scope of the present disclosure.

What is claimed is:

1. A display apparatus comprising:
a display panel including a front portion, a bent portion, and a pad portion bent from the bent portion and positioned under the front portion;
a first plate disposed between the front portion and the pad portion and disposed under the front portion;
a second plate disposed between the front portion and the pad portion and disposed on a top face of the pad portion; and
a flexible circuit board connected to a distal end of a bottom of the pad portion,
wherein the first plate includes a porous member,
wherein the second plate includes a transparent area and a non-transparent area,
wherein the flexible circuit board vertically overlap the transparent area and vertically non-overlap the non-transparent area.

2. The display apparatus of claim 1, wherein the porous member includes a conductive metal and a plurality of pores formed inside the conductive metal.

3. The display apparatus of claim 1, wherein the second plate includes at least one of polyethylene terephthalate (PET), polyimide (PI), or polyethylene naphthalate (PEN).

4. The display apparatus of claim 1, wherein the device further comprises a connection member disposed between the first plate and the second plate.

5. The display apparatus of claim 1, wherein thicknesses of the first plate and the second plate are different from each other.

6. The display apparatus of claim 3,
wherein the non-transparent area includes a porous member.

7. The display apparatus of claim 1, wherein the first plate has a larger area size than an area size of the second plate.

8. The display apparatus of claim 1, wherein the second plate includes a second plate adhesive layer disposed on one face thereof,
wherein the second plate is fixed to the first plate via the second plate adhesive layer.

9. The display apparatus of claim 1, wherein the second plate is made of an adhesive material,
wherein the adhesive material includes at least one of OCA (Optical Clear Adhesive), OCR (Optical Clear Resin), or PSA (Pressure Sensitive Adhesive).

10. The display apparatus of claim 9, wherein the second plate is in direct contact with the first plate.

11. A display apparatus comprising:
a display panel including a first portion for displaying an image and a second portion with a driver circuit, wherein at least a part of the display panel is bent such that the second portion is positioned under the first portion;
a first plate disposed below the first portion of the display panel;
a second plate disposed below the first plate and on a top surface of the second portion of the display panel, wherein at least a part of the second plate is transparent; and a circuit board attached to a bottom surface of the second portion of the display panel, wherein the circuit board overlaps the part of the second plate that is transparent, wherein another part of the second plate is non-transparent.

12. The display apparatus of claim 11, wherein the transparent part of the second plate is formed from at least one or a combination of polyethylene terephthalate (PET), polyimide (PI), or polyethylene naphthalate (PEN).

13. The display apparatus of claim 11, further comprising a connection member disposed between the first plate and the second plate.

14. The display apparatus of claim 11, further comprising an adhesive layer on the transparent part of the second plate, wherein the adhesive layer is attached to the first plate, and wherein the adhesive layer includes at least one or a combination of optical clear adhesive (OCA), optical clear resin (OCR), and pressure sensitive adhesive (PSA).

15. The display apparatus of claim 11, wherein at least the transparent part of the second plate includes an adhesive material, and wherein the transparent part of the second plate is directly attached to the first plate.

16. The display apparatus of claim 11, wherein at least a part of the first plate is formed of a porous member including a conductive metal and a plurality of pores formed within the conductive metal.

17. A display apparatus comprising:
a display panel including a first portion for displaying an image and a second portion with a driver circuit, wherein at least a part of the display panel is bent such that the second portion is positioned under the first portion;
a first plate disposed below the first portion of the display panel;
a second plate disposed below the first plate and on a top surface of the second portion of the display panel, wherein at least a part of the second plate is transparent; and
a circuit board attached to a bottom surface of the second portion of the display panel, wherein the circuit board overlaps the part of the second plate that is transparent, wherein one or more indentations are formed at an interface between the circuit board and the bottom surface of the second portion of the display panel.

18. The display apparatus of claim 17, wherein the circuit board is attached to the bottom surface of the second portion of the display panel with a conductive adhesive, and wherein one or more conductive balls in the conductive adhesive are disposed at the interface.

* * * * *